(12) United States Patent
Park

(10) Patent No.: US 11,815,772 B2
(45) Date of Patent: Nov. 14, 2023

(54) DISPLAY DEVICE INCLUDING FIRST AND SECOND SWITCHING ELEMENTS

(71) Applicant: Samsung Display Co., Ltd., Yongin-si (KR)

(72) Inventor: Do Yeong Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 104 days.

(21) Appl. No.: 17/118,522

(22) Filed: Dec. 10, 2020

(65) Prior Publication Data
US 2021/0278734 A1     Sep. 9, 2021

(30) Foreign Application Priority Data

Mar. 3, 2020 (KR) .................. 10-2020-0026447

(51) Int. Cl.
| | |
|---|---|
| *G02F 1/1362* | (2006.01) |
| *G02F 1/1368* | (2006.01) |
| *H01L 27/12* | (2006.01) |

(52) U.S. Cl.
CPC ...... *G02F 1/136286* (2013.01); *G02F 1/1368* (2013.01); *G02F 1/136222* (2021.01); *G02F 1/136227* (2013.01); *H01L 27/1244* (2013.01); *H01L 27/1248* (2013.01); *H01L 27/1255* (2013.01); *G02F 2201/40* (2013.01)

(58) Field of Classification Search
CPC .................. G02F 1/136286; G02F 1/13624
See application file for complete search history.

(56) References Cited

U.S. PATENT DOCUMENTS

| | | |
|---|---|---|
| 9,508,748 B2 | 11/2016 | Park et al. |
| 9,632,376 B2 | 4/2017 | Han et al. |
| 9,927,662 B2 | 3/2018 | Lim et al. |

(Continued)

FOREIGN PATENT DOCUMENTS

| | | |
|---|---|---|
| KR | 2015-0084230 | 7/2015 |
| KR | 2016-0117786 | 10/2016 |

(Continued)

OTHER PUBLICATIONS

Extended European Search Report dated Jul. 29, 2021, issued in European Patent Application No. 21160071.3.

*Primary Examiner* — Lauren Nguyen
(74) *Attorney, Agent, or Firm* — H.C. Park & Associates, PLC

(57) ABSTRACT

A display device includes a gate line extended in a first direction and a data line extended in a second direction crossing the first direction; a first switching element including a first source electrode connected to the data line, a first drain electrode, and a first gate electrode connected to the gate line; and a second switching element including a second source electrode connected to the data line, a second drain electrode, and a second gate electrode connected to the gate line. A region of the first drain electrode overlapping the first gate electrode extends in the second direction, the second source electrode is extended in the second direction, and is parallel with the first and second drain electrodes. A region of the second drain electrode overlapping the second gate electrode includes a first region extended in the first direction and a second region extended in the second direction.

13 Claims, 17 Drawing Sheets

(56) References Cited

U.S. PATENT DOCUMENTS

| | | | |
|---|---|---|---|
| 2013/0083263 A1 | 4/2013 | Kim et al. | |
| 2015/0109266 A1* | 4/2015 | Hong | G02F 1/136286 345/103 |
| 2015/0198851 A1* | 7/2015 | Park | G02F 1/134309 257/72 |
| 2016/0216570 A1* | 7/2016 | Yang | G02F 1/134309 |
| 2017/0205677 A1 | 7/2017 | Seo | |
| 2019/0018268 A1 | 1/2019 | Lee et al. | |
| 2020/0004069 A1 | 1/2020 | Kim et al. | |

FOREIGN PATENT DOCUMENTS

| | | |
|---|---|---|
| KR | 2017-0086748 | 7/2017 |
| KR | 2017-0096256 | 8/2017 |

* cited by examiner

DISPLAY DEVICE INCLUDING FIRST AND SECOND SWITCHING ELEMENTS

CROSS-REFERENCE TO RELATED APPLICATION

This application claims priority from and the benefit of Korean Patent Application No. 10-2020-0026447, filed on Mar. 3, 2020, which is hereby incorporated by reference for all purposes as if fully set forth herein.

BACKGROUND

Field

Exemplary embodiments of the invention relate generally to a display device and, more specifically to the display device capable of reducing a range of a difference in kickback voltage between sub-pixels in a pixel.

Discussion of the Background

Display devices have become more and more important as multimedia technology evolves. Accordingly, a variety of types of display devices such as liquid-crystal display (LCD) devices and organic light-emitting display (OLED) devices are currently used.

Among these, an LCD device is one of the most commonly used flat panel display devices. An LCD device includes two substrates where field generating electrodes such as pixel electrodes and a common electrode are formed, and a liquid-crystal layer disposed therebetween. An LCD device displays an image in such a manner that voltage is applied to field generating electrodes to generate electric field across a liquid-crystal layer, and liquid-crystal molecules in the liquid-crystal layer are aligned by the electric field so as to control the polarization of incident light.

An LCD device may be an active matrix LCD device using thin-film transistors. Specifically, thin-film transistors are connected to pixel electrodes, and pixels are driven by the voltage held by capacitor capacitances of the thin-film transistors.

The above information disclosed in this Background section is only for understanding of the background of the inventive concepts, and, therefore, it may contain information that does not constitute prior art.

SUMMARY

One or more exemplary embodiments of the inventive concepts are capable of reducing a range of a difference in kickback voltage between sub-pixels in a pixel.

In one or more exemplary embodiments of the inventive concepts, a display device includes display device capable of improving the aperture ratio of the pixels.

According to one or more exemplary embodiments of the invention, it is possible to prevent a difference between the capacitance of a first gate-drain capacitor and the capacitance of a second gate-drain capacitor from increasing, thereby reducing the range of a difference in kickback voltage between a first sub-pixel area and a second sub-pixel area. As a result, it is possible to suppress mura defects due to luminance difference on the display device.

According to one or more exemplary embodiments of the invention, forming a plurality of contact holes overlapping via holes of a color filter allows to improve the aperture ratio of the pixels.

In addition, according to one or more exemplary embodiments of the invention, a second switching element is spaced apart from a third switching element, the pixels can be designed more freely.

Additional features of the inventive concepts will be set forth in the description which follows, and in part will be apparent from the description, or may be learned by practice of the inventive concepts.

According to one or more exemplary embodiments of the invention, a display device includes a gate line extended in a first direction and a data line extended in a second direction crossing the first direction on a substrate. The display device also includes a first switching element comprising a first source electrode connected from the data line, a first drain electrode spaced apart from the first source electrode, and a first gate electrode connected to the gate line; and a second switching element comprising a second source electrode connected to the data line, a second drain electrode spaced apart from the second source electrode, and a second gate electrode connected to the gate line, wherein a region of the first drain electrode overlapping the first gate electrode is extended in the second direction. The second source electrode is extended in the second direction, and is disposed in parallel with the first drain electrode and the second drain electrode, and a region of the second drain electrode overlapping the second gate electrode includes a first region extended in the first direction and a second region extended in the second direction.

According to one or more exemplary embodiments, the second region of the second drain electrode and the second source electrode may face each other and may be arranged in parallel.

According to one or more exemplary embodiments, the second region of the second drain electrode may entirely overlap the gate line, and a portion of the first region of the second drain electrode may not overlap the gate line.

According to one or more exemplary embodiments, the first switching element comprises a first semiconductor region in which a first channel region is formed between the first source electrode and the first drain electrode, and the second switching element comprises a second semiconductor region in which a second channel region is formed between the second source electrode and the second region of the second drain electrode.

According to one or more exemplary embodiments, a longitudinal direction of each of the first channel region and the second channel region may be parallel to the first direction.

According to one or more exemplary embodiments, a length of the first channel region may be a shortest distance between the first source electrode and the first drain electrode, and wherein a length of the second channel region may be a shortest distance between the second source electrode and the second drain electrode.

According to one or more exemplary embodiments, the first source electrode and the second source electrode may be disposed directly on a same layer and formed of a same material.

According to one or more exemplary embodiments, the display device may further comprise a storage line disposed in parallel with the gate line; and a third switching element comprising a third source electrode connected from the storage line, a third drain electrode spaced apart from the third source electrode, and a third gate electrode connected to the gate line.

According to one or more exemplary embodiments, third drain electrode may be connected to the second drain electrode, and wherein the third source electrode and the second region of the second drain electrode may face each other and arranged in parallel.

According to one or more exemplary embodiments, the third switching element comprises a third semiconductor region in which a third channel region may be formed between the third source electrode and the second region of the second drain electrode.

According to one or more exemplary embodiments, a longitudinal direction of each of the first channel region, the second channel region and the third channel region may be parallel to the first direction.

According to one or more exemplary embodiments, the display device may further comprise the storage line disposed in parallel with the gate line; a color filter disposed on the first to third source electrodes and the first to third drain electrodes; and an insulating layer disposed on the color filter, wherein the color filter includes a first via hole exposing the first drain electrode and a second via hole exposing the third source electrode and the second drain electrode, and wherein the insulating layer includes a first contact hole exposing the first drain electrode, a second contact hole exposing the third source electrode, and a third contact hole exposing the second drain electrode.

According to one or more exemplary embodiments, the first contact hole may overlap the first via hole, and the second contact hole and the third contact hole may overlap the second via hole.

According to one or more exemplary embodiments, the first drain electrode may be connected to an adjacent first sub-pixel electrode through the first contact hole, the third source electrode may be connected to the storage line through the second contact hole, and the second drain electrode may be connected to an adjacent second sub-pixel electrode through the third contact hole.

The display device may further comprise a first conductive pattern extended from the third source electrode and overlapping the second contact hole and the second via hole; and a second conductive pattern extended from the second drain electrode and overlapping the third contact hole and the second via hole, wherein the first conductive pattern and the second conductive pattern are spaced apart from each other, with the gate line therebetween, and do not overlap the gate line.

According to one or more exemplary embodiments of the invention, a display device includes a gate line extended in a first direction, a storage line parallel to the gate line, and a data line extended in a second direction crossing the first direction on a substrate, The display device also includes a first switching element comprising a first source electrode connected from the data line, a first drain electrode spaced apart from the first source electrode, and a first gate electrode connected to the gate line; a second switching element comprising a second source electrode connected to the data line, a second drain electrode spaced apart from the second source electrode, and a second gate electrode connected to the gate line; and a third switching element comprising a third source electrode connected to the storage line, a third drain electrode spaced apart from the third source electrode, and a third gate electrode connected to the gate line, wherein a region of the first drain electrode overlapping the first gate electrode is extended in the second direction. The second source electrode is extended in the second direction, and is disposed in parallel with the first drain electrode and the second drain electrode, and a region of the second drain electrode overlapping the second gate electrode comprises a first region extended in the first direction and a second region extended in the second direction, and wherein the second drain electrode and the third drain electrode are formed of a single drain pattern.

According to one or more exemplary embodiments, the drain pattern comprises the second drain electrode, the third drain electrode, and a drain contact disposed between the second drain electrode and the third drain electrode.

According to one or more exemplary embodiments, the second drain electrode and the third drain electrode may be spaced apart from each other with the drain contact therebetween.

According to one or more exemplary embodiments, the second drain electrode may be extended in a direction toward the adjacent second source electrode in the first direction from one side of the drain contact, and wherein the third drain electrode may be extended in a direction toward the adjacent storage line in the second direction from the other side of the drain contact.

According to one or more exemplary embodiments, the first source electrode and the second source electrode may be connected to each other, and wherein the first drain electrode and the second drain electrode may be disposed adjacent to each other with the second source electrode therebetween.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
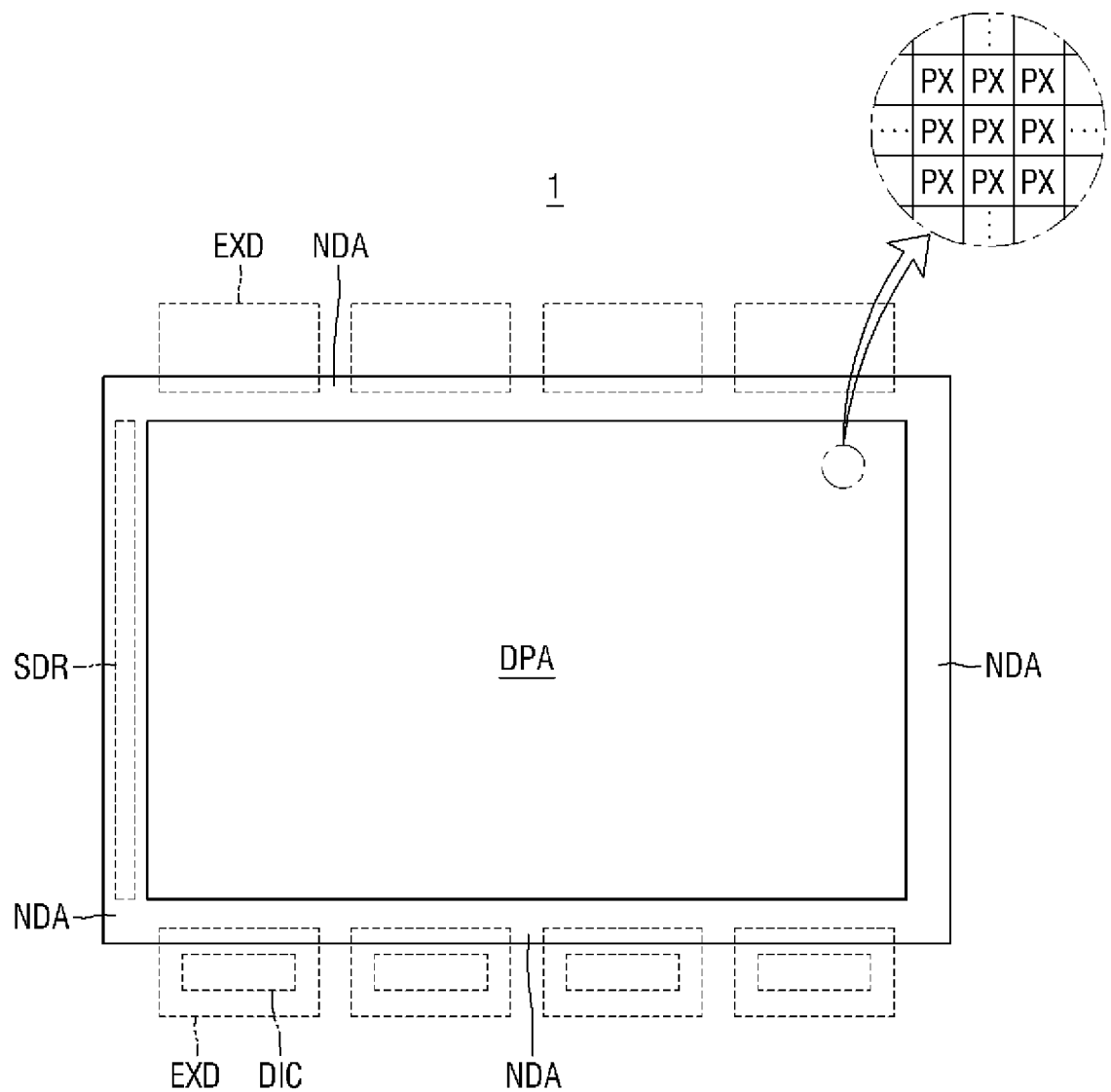
FIG. 1 is a plan view of a display device according to an embodiment of the inventive concepts.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In the accompanying figures, the size and relative sizes of layers, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described with reference to the accompanying drawings.

FIG. 1 is a plan view of a display device according to an exemplary embodiment of the present disclosure.

In FIG. 1, a liquid-crystal display device will be described as an example of a display device 1 according to an exemplary embodiment of the present disclosure, and the liquid-crystal display device will be simply referred to as a display device unless it is necessary to discern them. It is, however, to be understood that the exemplary embodiments of the present disclosure are not limited to the liquid-crystal display device, and any other display device listed above or well known in the art may be employed without departing from the scope of the present disclosure.

The display device 1 may include the display area DA and a non-display area NDA. The display area DPA may be an active area where images are displayed. The display area DPA may have, but is not limited to, a rectangular shape like the general shape of the display device 1 when viewed from the top.

The display area DPA may include a plurality of pixels PX. The plurality of pixels PX may be arranged in a matrix when viewed from the top. The shape of each of the pixels PX may be, but is not limited to, a rectangle or a square when viewed from the top. Each of the pixels PX may have a diamond shape having sides inclined with respect to a side of the display device 1. The plurality of pixels PX may include different color pixels PX. For example, the plurality of pixels PX may include, but is not limited to, a red first color pixel PX, a green second color pixel PX, and a blue third color pixel PX. The stripe-type pixels and pentile-type pixels may be arranged alternately.

The non-display areas NDA may be disposed around the display area DPA. The non-display areas NDA may surround the display area DPA entirely or partially. The display area DPA may have a rectangular shape, and the non-display areas NDA may be disposed to be adjacent to the four sides of the display area DPA. The non-display area NDA may form the bezel of the display device 1.

In the non-display area NDA, a driving circuit or a driving element for driving the display area DPA may be disposed. According to an exemplary embodiment of the present disclosure, a pad area is disposed on the display substrate of the display device 1 in a first non-display area NDA disposed adjacent to a first longer side (the lower side in FIG. 1) of the display device 1 and a second non-display area NDA adjacent to a second longer side (the upper side in FIG. 1) of the display device 1. An external device EXD may be mounted on a pad electrode of the pad area. Examples of the external device EXD may include a connection film, a printed circuit board, a driving chip DIC, a connector, a line connection film, etc. A scan driver SDR formed directly on the display substrate of the display device 1 may be disposed in the third non-display area NDA disposed adjacent to a first shorter side of the display device 1 (the left side in FIG. 1).

Figure 2:
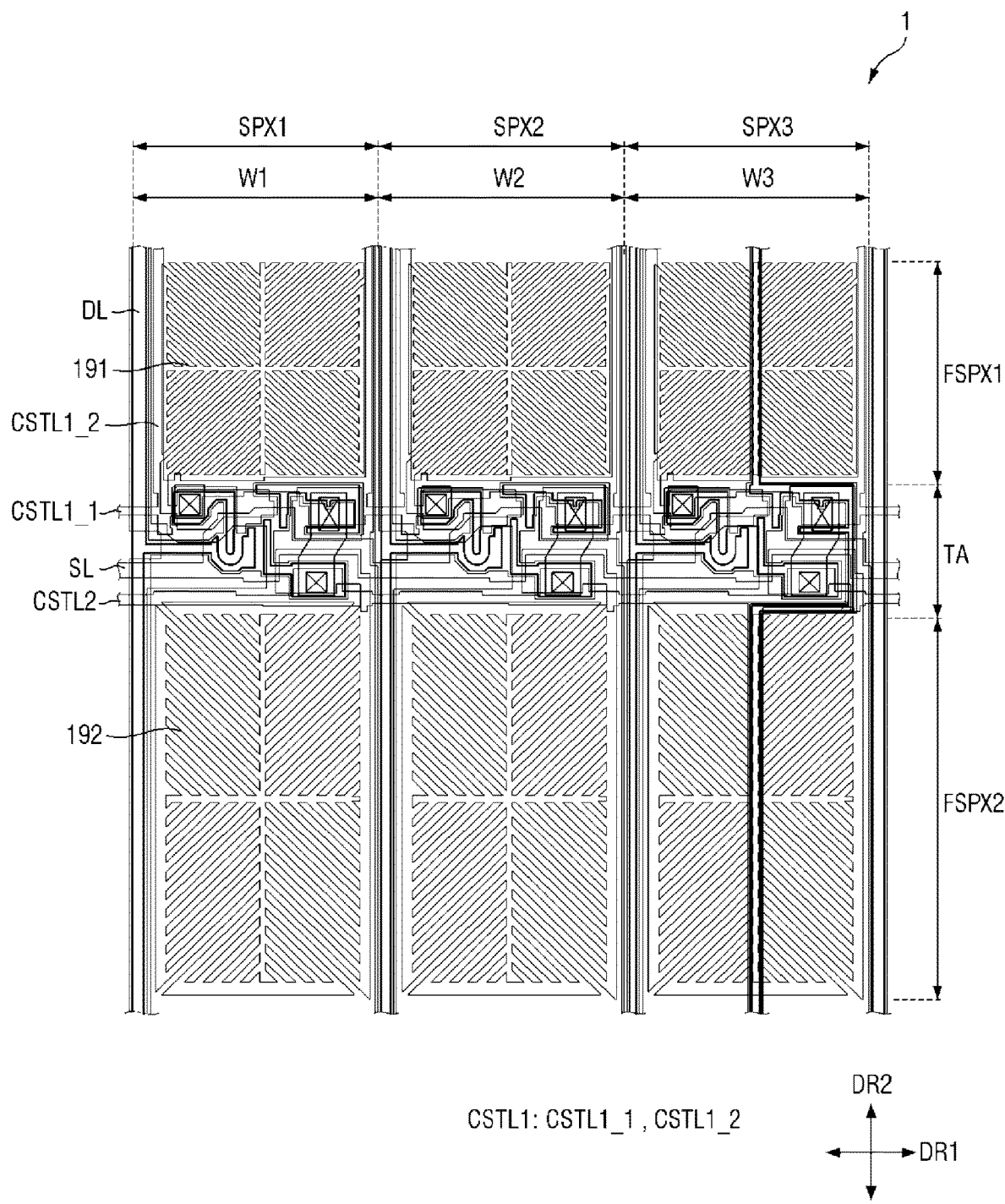
FIG. 2 is a plan view showing pixels of a display device according to an embodiment of the inventive concepts.

FIG. 2 is a plan view showing pixels of a display device according to an exemplary embodiment of the present disclosure.

In FIG. 2, each of the pixels PX may include a plurality of color pixels SPX1, SPX2 and SPX3. According to an exemplary embodiment of the present disclosure, a first color pixel SPX1 may be a red pixel, a second color pixel SPX2 may be a green pixel, and a third color pixel SPX3 may be a blue pixel. Data lines DL, gate lines SL, and storage lines CSTL1 and CSTL2 may pass through each of the color pixels SPX1, SPX2 and SPX3. The data lines DL may be extended in the second direction DR2, and the gate lines SL may be extended in the first direction DR1.

A first storage line CSTL1 may include a main storage line part CSTL1-1 extended along the first direction DR1, and subsidiary storage line parts CSTL1-2 connected to the main storage line part CSTL1-1 and extended along the second direction DR2. There may be two subsidiary storage line parts CSTL1-2. One of the subsidiary storage line parts CSTL1-2 may be disposed between a data line DL connected to each color pixel SPX1, SPX2 and SPX3 and a sub-pixel electrode of each color pixel SPX1, SPX2 and SPX3, which will be described later. The other one of the subsidiary storage line parts CSTL1-2 may be disposed between a sub-pixel electrode of each color pixel SPX1, SPX2 and SPX3 and the data line DL connected to each color pixel SPX1, SPX2 and SPX3. The second storage line CSTL2 may be extended along the first direction DR1. The second storage line CSTL2 and the gate line SL may be extended in the same direction.

Different data lines DL may pass through the color pixels SPX1, SPX2 and SPX3 of one pixel PX, respectively. The data lines DL passing through the color pixels SPX1, SPX2 and SPX3 may pass through color pixels adjacent thereto in the second direction DR2, respectively.

The same gate line SL and the first storage line CSTL1 may commonly pass through each color pixel SPX1, SPX2 and SPX3 of one pixel PX. The second storage line CSTL2 may commonly pass through the color pixels SPX1, SPX2 and SPX3.

Each of the color pixels SPX1, SPX2 and SPX3 may be defined as an area between data lines DL adjacent to each other in the first direction DR1. In addition, in the second direction DR2, each of the color pixels SPX1, SPX2 and SPX3 is defined as an area from a first sub-pixel electrode 191 to a second sub-pixel electrode 192 disposed on upper and lower sides, respectively, of the gate line SL passing through it.

Each of the color pixels SPX1, SPX2 and SPX3 may be divided into several areas. Sub-pixel areas FSPX1 and FSPX2 and a switching element area TA may be defined in each of the color pixels SPX1, SPX2 and SPX3. The first sub-pixel area FSPX1 may be defined as an area where the first sub-pixel electrode 191 is disposed, and the second sub-pixel area FSPX2 may be defined as an area where the second sub-pixel electrode 192 is disposed in the second direction DR2. Specifically, the first sub-pixel area FSPX1, the switching element area TA and the second sub-pixel area FSPX2 may be adjacent to one another and may be arranged in this order in the second direction DR2. According to an exemplary embodiment of the present disclosure, the size of the second sub-pixel area FSPX2 may be larger than the size of the first sub-pixel area FSPX1 when viewed from the top. That is to say, as shown in FIG. 2, when the width of the first sub-pixel area FSPX1 is equal to the width of the second sub-pixel area FSPX2 in the first direction DR1, the width of the second sub-pixel area FSPX2 may be greater than the width of the first sub-pixel area FSPX1 in the second direction DR2.

The first sub-pixel electrode 191 may be disposed in the first sub-pixel area FSPX1 of each of the color pixels SPX1, SPX2 and SPX3, and the second sub-pixel electrode 192 may be disposed in the second sub-pixel area FSPX2 of each of the color pixels SPX1, SPX2 and SPX3. The first storage line CSTL1 may be disposed between the first sub-pixel electrode 191 and the second sub-pixel electrode 192, and the gate line SL may be disposed between the first storage line CSTL1 and the second sub-pixel electrode 192. The second storage line CSTL2 may be disposed between the second sub-pixel electrode 192 and the gate line SL. The main storage line part CSTL1-1 of the first storage line CSTL1 may be disposed between the first sub-pixel electrode 191 of each color pixels SPX1, SPX2 and SPX3 and the second sub-pixel electrode 192 of the second sub-pixel part FSPX2 of color pixels SPX1, SPX2 and SPX3 adjacent thereto in the second direction DR2. The subsidiary storage line parts CSTL1-2 of the first storage line CSTL1 of each color pixel SPX1, SPX2 and SPX3 may be disposed between the data line DL of each color pixel SPX1, SPX2 and SPX3 and the first sub-pixel electrode 191 of the first sub-pixel area FSPX1 of each color pixel SPX1, SPX2 and SPX3, and between the first sub-pixel electrode 191 of the first sub-pixel area FSPX1 of each color pixel SPX1, SPX2 and SPX3 and the data line DL of color pixels adjacent thereto in the first direction DR1.

A voltage-dividing reference line RL extended in the second direction DR2 may further pass through the third color pixel SPX3. The voltage-dividing reference line RL may be electrically connected to the first storage line CSTL1 as described below, so that the voltage applied through the voltage-dividing reference line RL is transmitted to the first storage line CSTL1. The first storage line CSTL1 is commonly connected to each color pixel SPX1, SPX2 and SPX3 of the pixel PX, and thus the same storage voltage may be applied to each color pixel SPX1, SPX2 and SPX3 of the pixel PX.

When viewed from the top, the size of the third color pixel SPX3 may be larger than the size of each of the first color pixel SPX1 and the second color pixel SPX2. When viewed from the top, the width W3 of the third color pixel SPX3 in the first direction DR1 may be greater than the widths W1 and W2 of the first color pixel SPX1 and the second color pixel SPX2, respectively. This is to compensate for light loss in the first sub-pixel part FSPX1 and the second sub-pixel part FSPX2 of the third color pixel SPX3 because the voltage-dividing reference line RL passes through the third color pixel SPX3.

Figure 3:
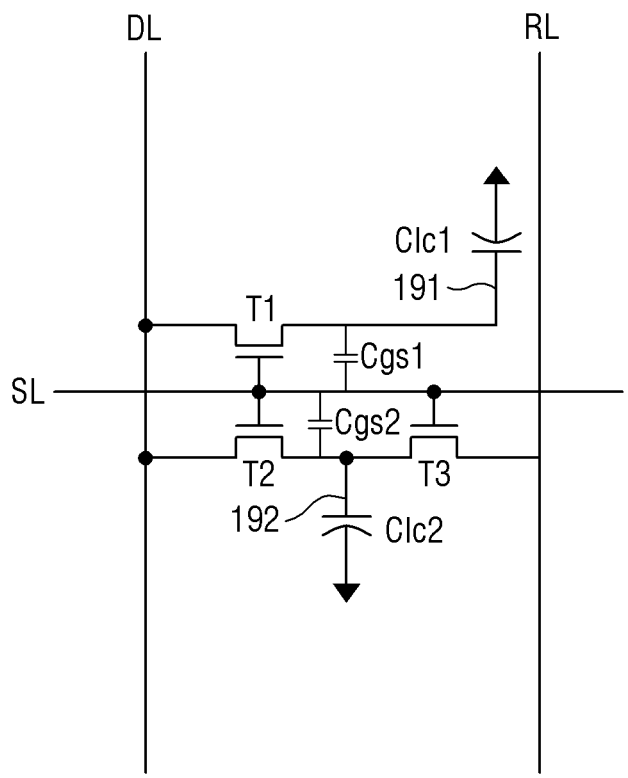
FIG. 3 is a circuit diagram of a pixel of a display device according to an embodiment of the inventive concepts.

FIG. 3 is a circuit diagram of a pixel of a display device according to an exemplary embodiment of the present disclosure.

In FIGS. 2 and 3, a data line DL and a voltage-dividing reference line RL crossing a gate line SL may be disposed. The gate line SL may transmit a scan signal to each of a first switching element T1, a second switching element T2, and a third switching element T3. The data line DL may transmit a data voltage to each of the first switching element T1 and the second switching element T2. A constant reference voltage (or a voltage-dividing reference voltage) may be applied to the voltage-dividing reference line RL.

The first sub-pixel area FSPX1 may include the first switching element T1 and a first liquid-crystal capacitor Clc1, and the second sub-pixel area FSPX2 may include the second switching element T2, a second liquid-crystal capacitor Clc2 and the third switching element T3. Each of the first switching element T1, the second switching element T2 and the third switching element T3 may be a thin-film transistor.

The first switching element T1 may include a first electrode connected to the data line DL, a second electrode connected to the first liquid-crystal capacitor Clc1, and a gate electrode connected to the gate line SL. The second electrode of the first switching element T1 may be connected to the first sub-pixel electrode 191 of the first liquid-crystal capacitor Clc1.

The second switching element T2 may include a first electrode connected to the data line DL, a second electrode connected to the second liquid-crystal capacitor Clc2, and a gate is electrode connected to the gate line SL. The second electrode of the second switching element T2 may be connected to the second sub-pixel electrode 192 of the second liquid-crystal capacitor Clc2.

The third switching element T3 may include a first electrode connected to the second liquid-crystal capacitor Clc2, a second electrode connected to the voltage-dividing reference line RL, and a gate electrode connected to the gate line SL. A reference voltage for dividing the voltage may be applied to the second electrode of the third switching element T3 through the voltage-dividing reference line RL.

The first electrode of each of the first switching element T1, the second switching element T2 and the third switching element T3 may be a source electrode, and the second electrode thereof may be a drain electrode. The first liquid-crystal capacitor Clc1 and the second liquid-crystal capacitor Clc2 may be connected to a common electrode, and a common voltage may be applied to the common electrode.

When a gate-on voltage is applied to the gate line SL, each of the first switching element T1, the second switching element T2 and the third switching element T3 may be turned on, and the first liquid-crystal capacitor Clc1 and the second liquid-crystal capacitor Clc2 may be charged by the data voltage transmitted through the data line DL. The data voltage applied to the first sub-pixel electrode 191 may be equal to the data voltage applied to the second sub-pixel electrode 192. The first liquid-crystal capacitor Clc1 may be charged with a voltage equal to the difference between the common voltage and the data voltage, and the second liquid-crystal capacitor Clc2 may be charged with a voltage equal to a difference between the data voltage divided by the third switching element T3 and the common voltage.

Since the third switching element T3 is connected in series with the second switching element T2 and the third switching element T3 is turned on, the data voltage transmitted to the second sub-pixel area FSPX2 may be divided by the second switching element T2 and the third switching element T3. The data voltage may be distributed based on the size (or capacity) of the channel of the second switching element T2 and the size of the channel of the third switching element T3. Therefore, even though the data voltages transmitted to the first sub-pixel area FSPX1 and the second sub-pixel area FSPX2 through the data line DL are the same, the voltage charged at the first liquid-crystal capacitor Clc1 may be different from that of the second liquid-crystal capacitor Clc2. For example, the voltage charged in the second liquid-crystal capacitor Clc2 may be smaller than the voltage charged in the first liquid-crystal capacitor Clc1. This can improve the quality of images on the sides of the display device 1.

The voltage level of the reference voltage applied to the second electrode of the third switching element T3 may be equal to or higher than the voltage level of the common voltage applied to the common electrode. For example, when the common voltage is approximately 7V, the reference voltage applied to the second electrode of the third switching element T3 may be, but is not limited to, approximately 7 V to 11 V.

A first gate-drain capacitor Cgs1 may be formed between the second electrode of the first switching element T1 and the gate electrode of the first switching element T1. A second gate-drain capacitor Cgs2 may be formed between the second electrode of the second switching element T2 and the gate electrode of the second switching element T2. Each of the gate-drain capacitors Cgs1 and Cgs2 may be a parasitic capacitor.

Figure 4:
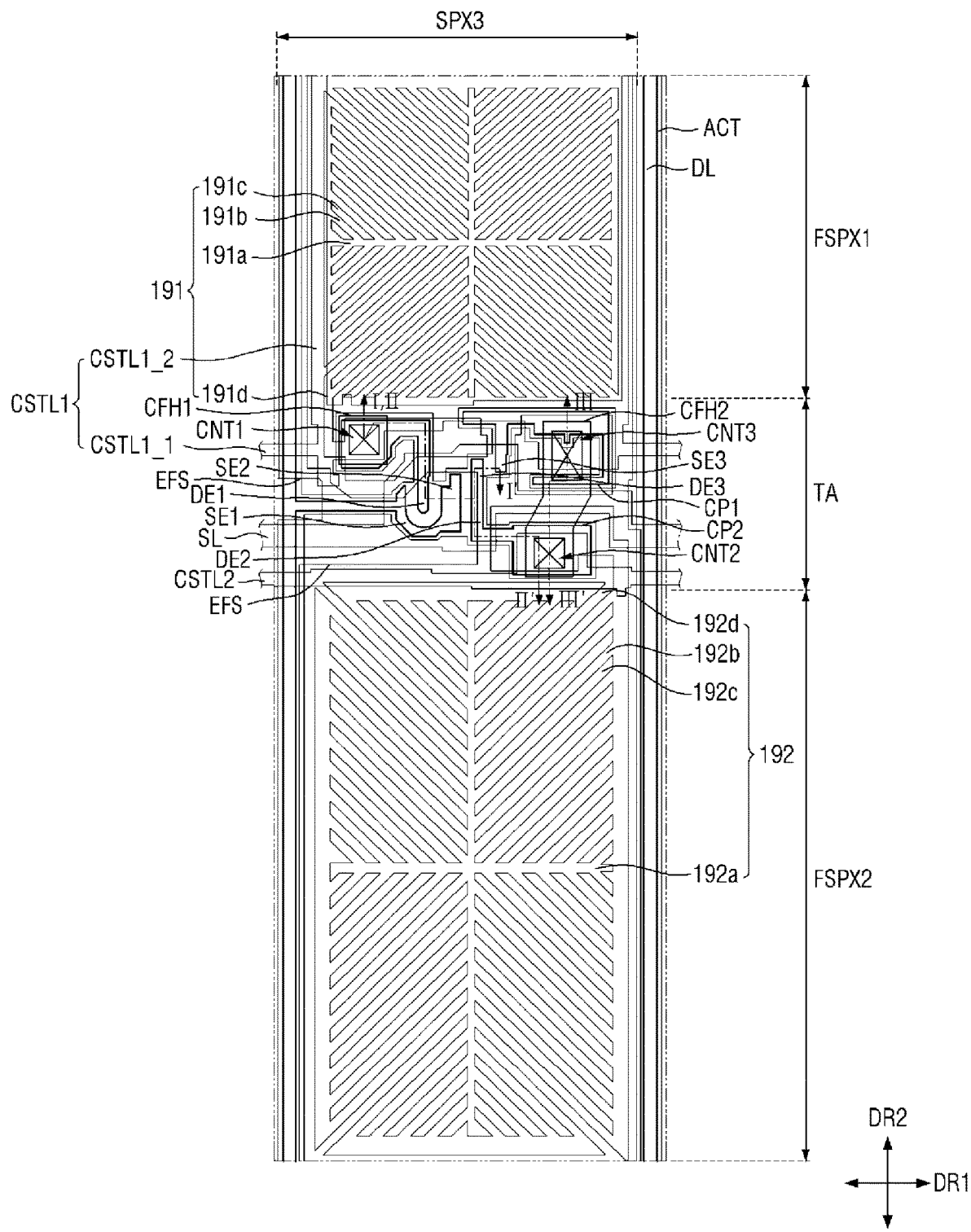
FIG. 4 is an enlarged plan view of the entire first color pixel of FIG. 3.
Figure 5:
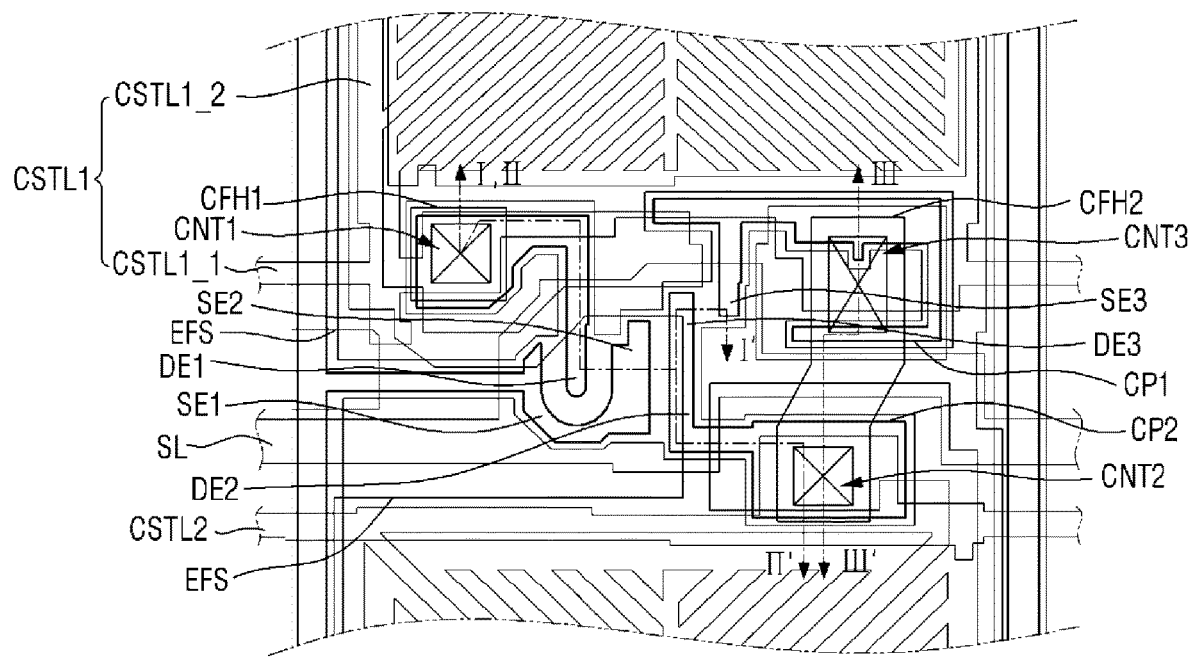
FIG. 5 is an enlarged plan view of a part of the first color pixel of FIG. 3.
Figure 6:
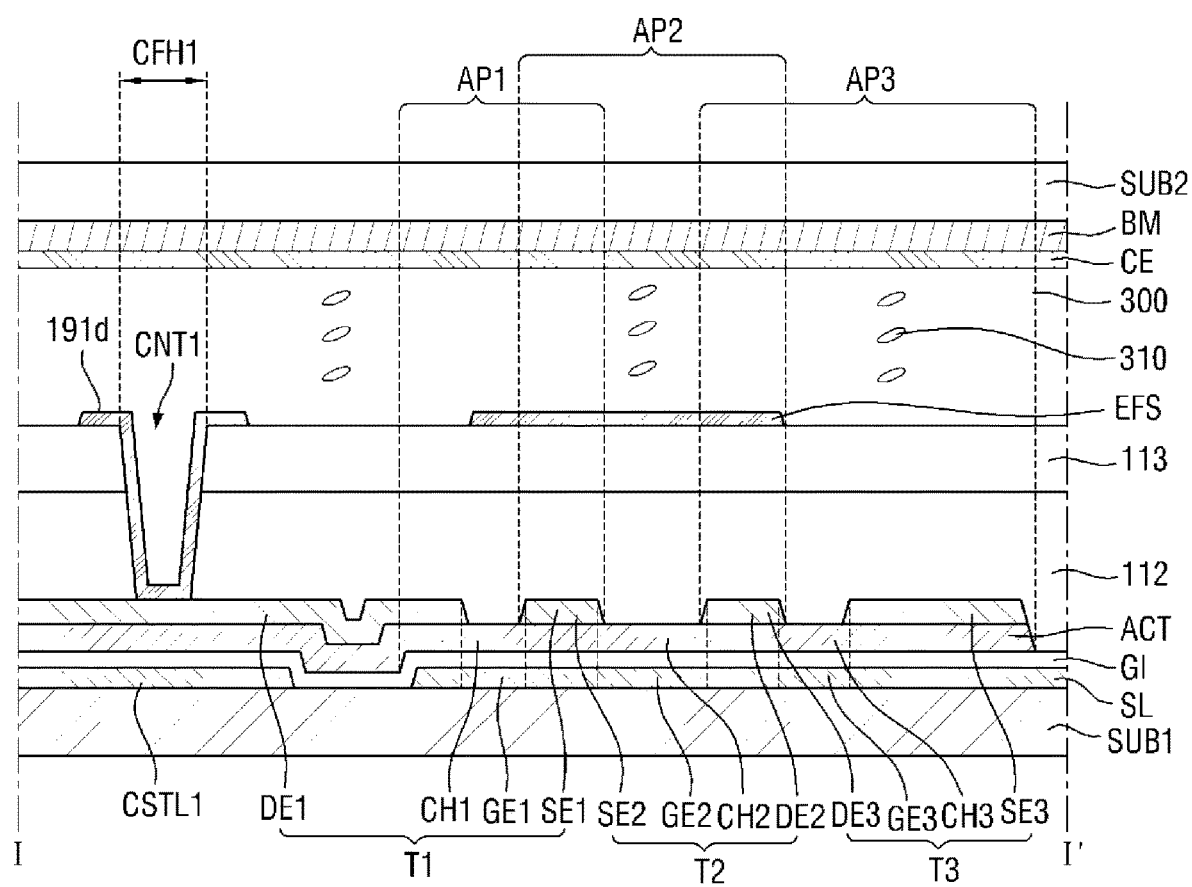
FIG. 6 is a cross-sectional view taken along line I-I' of FIG. 4.
Figure 7:
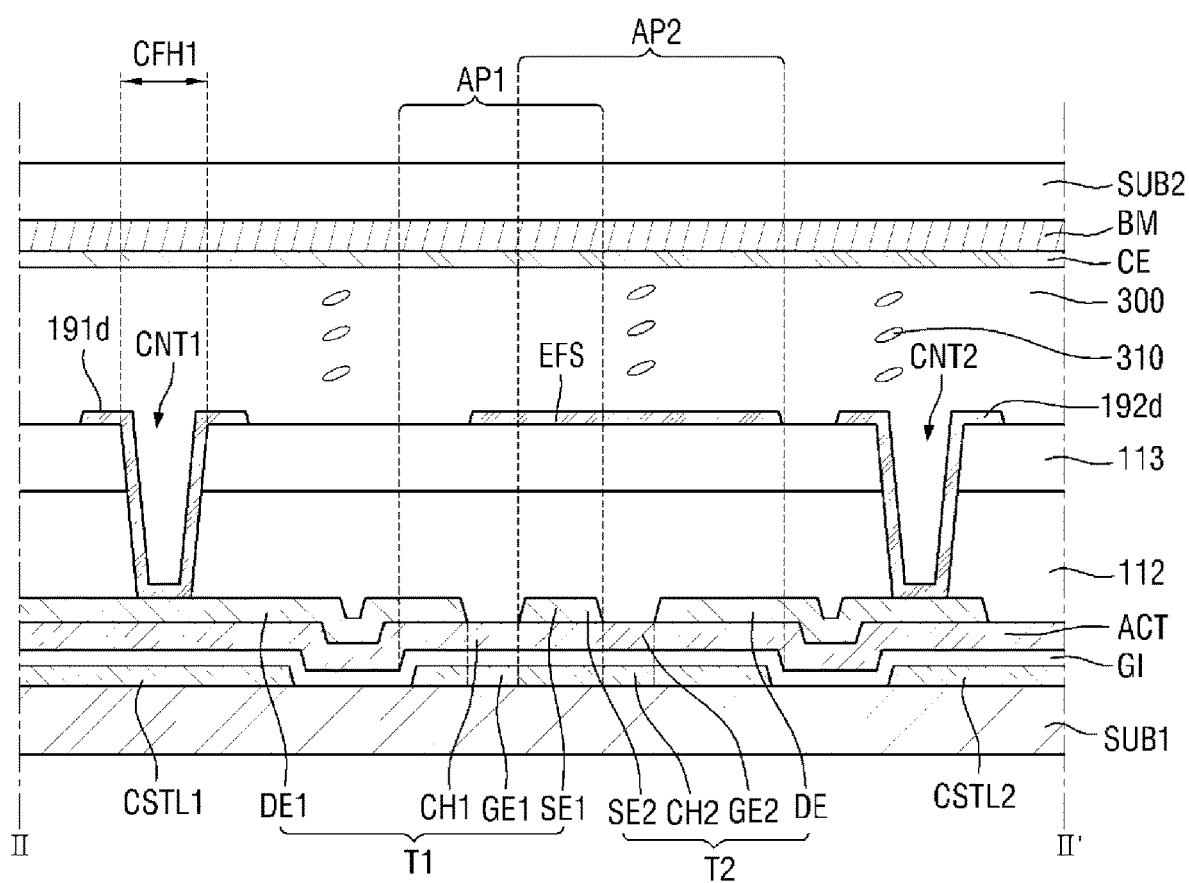
FIG. 7 is a cross-sectional view taken along line II-II' of FIG. 4.

FIG. 4 is an enlarged plan view of the entire first color pixel of FIG. 3. FIG. 5 is an enlarged plan view of a portion of the first color pixel of FIG. 3. FIG. 6 is a cross-sectional view taken along line I-I' of FIG. 4. FIG. 7 is a cross-sectional view taken along line II-II' of FIG. 4. Hereinafter, the first color pixel SPX1 will be described as an example since the structure of the first color pixel SPX1 is identical to the structure of the second color pixel SPX2.

In FIGS. 4 and 5, the first color pixel SPX1 may include a first switching element T1, a second switching element T2, and a third switching element T3.

A first source electrode SE1 of the first switching element T1 may be connected to the data line DL, and a first drain electrode DE1 of the first switching element T1 may be connected to a first sub-pixel electrode 191 through a first contact hole CNT1. The first switching element T1 may include a first gate electrode connected to a gate line SL. According to an exemplary embodiment of the present disclosure, the first gate electrode may be a gate line SL.

A first source electrode SE1 of the first switching element T1 may protrude from the data line DL and may be extended in the first direction DR1. The first source electrode SE1 of the first switching element T1 may be connected directly to the data line DL. The first source electrode SE1 of the first switching element T1 may be formed integrally with the data line DL. The first source electrode SE1 of the first switching element T1 may have a curved shape such as a U-shape. The first drain electrode DE1 of the first switching element T1 may be spaced apart from the first source electrode SE1 of the first switching element T1 in the second direction DR2. The first drain electrode DE1 of the first switching element T1 may have a polygonal shape when viewed from the top. A portion of the first drain electrode DE1 may protrude downward in the second direction DR2 (toward the first source electrode SE1 of the first switching element T1). The portion of the first drain electrode DE1 of the first switching element T1 protruding downward in the second direction DR2 may be surrounded by the first source electrode SE1 of the first switching element T1 when viewed from the top.

The second source electrode SE2 of the second switching element T2 may be connected to the data line DL. The second source electrode SE2 may be formed integrally with the first source electrode SE1. The second drain electrode DE2 of the second switching element T2 may be connected to the second sub-pixel electrode 192 through the second contact hole CNT2. The second switching element T2 may include a second gate electrode connected to the gate line SL. According to an exemplary embodiment of the present disclosure, the second gate electrode may be the gate line SL.

The second source electrode SE2 may protrude from the data line DL and may be extended in the first direction DR1. The second source electrode SE2 may be connected directly to the data line DL. The second source electrode SE2 may be formed integrally with the data line DL. In addition, the second source electrode SE2 may be formed integrally with the first source electrode SE1 of the first switching element T1. The second drain electrode DE2 may be spaced apart from the second source electrode SE2 in the first direction DR1.

The third source electrode SE3 of the third switching element T3 may be connected to the voltage-dividing reference line RL through a third contact hole CNT3. The third drain electrode DE3 of the third switching element T3 may be connected to the second sub-pixel electrode 192 through the second contact hole CNT2 and may be formed integrally with the second drain electrode DE2. According to an exemplary embodiment of the present disclosure, the second drain electrode DE2 and the third drain electrode DE3 may be formed of the same electrode pattern, and the second drain electrode DE2 and the third drain electrode DE3 may share it. The third switching element T3 may include a third gate electrode connected to the gate line SL. According to an exemplary embodiment of the present disclosure, the third gate electrode may be the gate line SL.

The first color pixel SPX1 may include the first sub-pixel electrode 191 and the second sub-pixel electrode 192.

Most of the first sub-pixel electrode 191 may be disposed in the first sub-pixel area FSPX1, and most of the second sub-pixel electrode 192 may be disposed in the second sub-pixel area FSPX2. The first sub-pixel electrode 191 may be in contact with the first drain electrode DE1 through the first contact hole CH1 and may be electrically connected to it. The second sub-pixel electrode 192 may be in contact with the second drain electrode DE2 through the second contact hole CH2 and may be electrically connected to it.

The first sub-pixel electrode 191 may include a first stem 191a disposed in the first sub-pixel area FSPX1, first branches 191b disposed in the first sub-pixel area PA1, extended outward from the first stem 191a and spaced apart from one another with a slit 191c therebetween, and a first extended part 191d extended from the first sub-pixel area FSPX1 to the switching element area TA.

The first stem 191a may include a horizontal stem part extended in the first direction DR1, and a vertical stem part extended in the second direction DR2. The first stem 191a may divide the pixel electrode 150 into subsidiary regions, that is, domains. The first stem 191a may be formed in a cross shape, for example. In such case, the first sub-pixel electrode 191 may be divided into four subsidiary regions by the first stem 191a. The first branches 191b positioned in different subsidiary regions may be extended in different directions. For example, the first branches 191b positioned in the upper right subsidiary region may be extended obliquely from the first stem 191a in the upper right direction, while the first branches 191b positioned in the lower right subsidiary region may be extended obliquely from the first stem 191a in the lower right direction. The first branches 191b positioned in the upper left subsidiary region may be extended obliquely from the first stem 191a in the upper left direction, while the first branches 191b positioned in the lower left subsidiary region may be extended obliquely from the first stem 191a in the lower left direction. The first extended part 191d may be extended from the first stem 191a or the first branches 191b to the switching element area TA and may be electrically connected to the first drain electrode DE1 through the first contact hole CNT1.

The second sub-pixel electrode 192 may include a second stem 192a disposed in the second sub-pixel area FSPX1, second branches 192b disposed in the second sub-pixel area FSPX2, extended outward from the second stem 192a and spaced apart from one another with a slit 192c therebetween, and a second extended part 192d extended from the second sub-pixel area FSPX2 to the switching element area TA.

The second stem 192a, the second branches 192b and the second extended part 192d are substantially identical to the first stem 191a, the first branches 191b and the first extended part 191d, respectively; and, therefore, the redundant description will be omitted.

The size of the first sub-pixel electrode 191 may be smaller than the size of the second sub-pixel electrode 192 when viewed from the top. Herein, the size of each of the first and second sub-pixel electrodes 191 and 192 may be measured based on the width in the first direction DR1 and the width in the second direction DR2. The width of each of the first and second sub-pixel electrodes 191 and 192 in the first direction DR1 when viewed from the top may be formed as the width from a portion of each of the sub-pixel electrodes 191 and 192 that is the most adjacent to the data line DL of the first color pixel SPX1 to a portion of each of the first and second sub-pixel electrodes 191 and 192 that is the most adjacent to the data line DL of the color pixel that is adjacent to the first color pixel in the first direction DR1. The width of the first sub-pixel electrode 191 in the first direction DR1 when viewed from the top may be defined as the width from a portion of the first sub-pixel electrode 191 of the first color pixel SPX1 that is the most adjacent to the first storage line CSTL1 to a portion thereof extended in the second direction DR2. The width of the second sub-pixel electrode 192 in the first direction DR1 when viewed from the top may be defined as the width from a portion of the second sub-pixel electrode 192 that is the most adjacent to the second storage line CSTL2 to a portion thereof extended in the second direction DR2.

The first color pixel SPX1 may further include a shielding line EFS. The shielding line EFS may be disposed at the same level as the first and second sub-pixel electrodes 191 and 192 described above. The shielding line EFS may be disposed to overlap with at least a portion of each of the data line DL, the gate line SL, the first switching element T1 and the second switching element T2, and may form a parasitic capacitor with a common electrode CE to be described later. By doing so, it is possible to prevent the liquid crystals from failing.

As shown in FIG. 4, the width of the first sub-pixel electrode 191 may be substantially identical to the width of the second sub-pixel electrode 192 in the first direction DR1. The width of the first sub-pixel electrode 191 in the second direction DR2 may be smaller than the width of the second sub-pixel electrode 192 in the second direction DR2.

Hereinafter, a cross-sectional structure of the first color pixel SPX1 described above will be described with reference to FIGS. 6 and 7 in conjunction with FIGS. 4 and 5.

In FIGS. 4, 5, 6 and 7, a substrate SUB may include a first substrate SUB1 and a second substrate SUB2 facing the first substrate SUB1. A plurality of pixels PX described above may be disposed on the first substrate SUB1, and a common electrode CE may be disposed on the second substrate SUB2. A liquid-crystal layer 300 including the liquid crystals 310 may be disposed between the pixels PX of the first substrate SUB1 and the common electrode CE of the second substrate SUB2.

The first substrate SUB1 may include an insulating material such as glass, quartz and a polymer resin. The polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. The first substrate SUB1 may include a metal material.

A first conductive layer may be disposed on the first substrate SUB1. The first conductive layer may include a gate line SL, a first gate electrode GE1, a second gate electrode GE2, a third gate electrode GE3, and storage lines CSTL1 and CSTL2. The first gate electrode GE1 may be the gate electrode of the first switching element T1, the second gate electrode GE2 may be the gate electrode of the second switching element T2, and the third gate electrode GE3 may be the gate electrode of the third switching element T3.

Each of the gate line SL, the first gate electrode GE1, the second gate electrode GE2, the third gate electrode GE3 and the storage lines CSTL1 and CSTL2 may be formed of the first conductive layer. They may be disposed on the same layer and may be formed of the same material. The first conductive layer may be formed of a single layer or multiple layers. When the first conductive layer is formed of a single layer, it may include one selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu) or an alloy thereof. In addition, when the first conductive layer is formed of multiple layers, it may be formed of the above-listed materials. For example, the first conductive layer may be formed of two layers of molybdenum/aluminum-neodymium, molybdenum/aluminum, or copper/titanium.

Each of the first gate electrode GE1, the second gate electrode GE2, and the third gate electrode GE3 may be electrically connected to the gate line SL. The first gate electrode GE1, the second gate electrode GE2, and the third gate electrode GE3 may be connected with one another. It is, however, to be understood that the present disclosure is not limited thereto. According to an exemplary embodiment of the present disclosure, the first gate electrode GE1, the second gate electrode GE2, and the third gate electrode GE3 may be the gate line SL.

A gate insulating layer GI may be disposed on the gate line SL, the first gate electrode GE1, the second gate electrode GE2, the third gate electrode GE3 and the storage lines CSTL1 and CSTL2, to insulate them from one another. The gate insulating layer GI may include inorganic insulating materials such as silicon compounds and metal oxides. For example, the gate insulating layer GI may include silicon oxide, silicon nitride, silicon oxynitride, aluminum oxide, tantalum oxide, hafnium oxide, zirconium oxide, titanium oxide, or a combination thereof. The gate insulating layer GI may be formed of a single layer or multiple layers of different materials.

A semiconductor layer ACT is located on the gate insulating layer GI. The semiconductor layer may include a first semiconductor region AP1, a second semiconductor region AP2, and a third semiconductor region AP3. The first semiconductor region AP1 may be defined as a region overlapping the first source electrode SE1, the first drain electrode DE1 and the first gate electrode GE1 of the first switching element T1. The second semiconductor region AP2 may be defined as a region overlapping the second source electrode SE2, the second drain electrode DE2 and the second gate electrode GE2 of the second switching element T2. The third semiconductor region AP3 may be defined as a region overlapping the third source electrode SE3, the third drain electrode DE3 and the third gate electrode GE3 of the third switching element T3.

The first semiconductor region AP1 to the third semiconductor region AP3 include channel regions CH1, CH2 and CH3, respectively. The first channel region CH1 may be defined as a region that overlaps with the first gate electrode GE1 of the first switching element T1 and is formed between the first source electrode SE1 and the first drain electrode DE1. The second channel region CH2 may be defined as a region that overlaps with the second gate electrode GE2 of the second switching element T2 and is formed between the second source electrode SE2 and the second drain electrode DE2. The third channel region CH3 may be defined as a region that overlaps with the third gate electrode GE3 of the third switching element T3 and is formed between the third source electrode SE3 and the third drain electrode DE3. In each of the first channel region CH1, the second channel region CH2 and the third channel region CH3, a channel (or a channel region) may be formed as the conductivity is revered between the source electrode and the drain electrode when an electric field is applied by the gate electrode overlapping it. According to an exemplary embodiment of the present disclosure, the first semiconductor region AP1 to the third semiconductor region AP3 may be formed in a single pattern.

According to an exemplary embodiment of the present disclosure, the semiconductor layer ACT may include a silicon-based semiconductor material such as amorphous silicon, polycrystalline silicon and monocrystalline silicon. According to another exemplary embodiment, the semiconductor layer ACT may include monocrystalline silicon, low-temperature polycrystalline silicon, amorphous silicon, or the like. In addition, the semiconductor layer ACT may include an oxide semiconductor as well. The semiconductor layer may include, for example, a binary compound (ABx), a ternary compound (ABxCy) and a quaternary compound (ABxCyDz) containing indium (In), zinc (Zn), gallium (Ga), tin (Sn), titanium (Ti), aluminum (Al), hafnium (Hf), zirconium (Zr), magnesium (Mg), etc. The semiconductor layer ACT may also include ITZO (oxide containing indium, tin, and titanium) or IGZO (oxide including indium, gallium, and tin).

An ohmic pattern including an ohmic contact layer (not shown) may be further disposed on the semiconductor layer ACT including the first semiconductor region AP1 to the third semiconductor region AP3. The ohmic contact layer may be disposed between the source and drain electrodes of each of the switching elements T1 to T3 and the semiconductor layer ACT, to lower the Schottky barrier between metal and silicon, i.e., the work function to thereby reduce a contact resistance. The ohmic contact layer may be formed of amorphous silicon highly doped with n-type impurities.

A second conductive layer may be disposed on the first substrate SUB1 and the semiconductor layer ACT. The second conductive layer may include the data line DL, the source electrode and the drain electrode of each of the switching elements T1, T2 and T3, and the voltage-dividing reference line. Each of the data line DL, the source electrode and the drain electrode of the first to third switching elements T1, T2 and T3 may be formed of the second conductive layer. They may be formed of the same material and may be disposed directly on the same layer.

The second conductive layer may be formed of a single layer or multiple layers. When the second conductive layer is formed of a single layer, it may include one selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu) or an alloy thereof. In addition, when the second conductive layer is formed of multiple layers, it may be formed of the above-listed materials. For example, the second conductive layer may be formed of two layers of molybdenum/aluminum-neodymium, molybdenum/aluminum or copper/titanium, or three layers of molybdenum/titanium/molybdenum or molybdenum/aluminum/molybdenum.

The first source electrode SE1 of the first switching element T1 may be electrically connected to the data line DL. The first source electrode SE1 of the first switching element T1 may be disposed on the semiconductor layer ACT and may be electrically connected to the first semiconductor region AP1. The first drain electrode DE1 of the first switching element T1 may be disposed on the semiconductor layer ACT and may be electrically connected to the first semiconductor region AP1.

The second source electrode SE2 of the second switching element T2 may be electrically connected to the data line DL. The second source electrode SE2 may be disposed on the semiconductor layer ACT and may be electrically connected to the second semiconductor region AP2. The second drain electrode DE2 of the second switching element T2 may be disposed on the semiconductor layer ACT and can be electrically connected to the second semiconductor region AP2.

The third source electrode SE3 of the third switching element T3 may be electrically connected to the first storage line CSTL1. According to an exemplary embodiment of the present disclosure, the third source electrode SE3 may be connected directly to the first storage line CSTL1 through the third contact hole. The third source electrode SE3 may be disposed on the semiconductor layer ACT and may be electrically connected to the third semiconductor region AP3. The third drain electrode DE3 of the third switching element T3 may be disposed on the semiconductor layer ACT and can be electrically connected to the third semiconductor region AP3.

As the second conductive layer is patterned together with the semiconductor layer ACT, the semiconductor layer ACT may be disposed in a similar shape under the second conductive layer, for example, the data line DL, the first to third source electrodes SE1, SE2 and SE3, the first to third drain electrodes DE1, DE2 and DE3 and the voltage-dividing reference line RL.

A color filter 112 may be disposed over the first switching element T1, the second switching element T2 and the third switching element T3 formed on the first substrate SUB1. The color filter 112 may include a red color filter, a green color filter and a blue color filter. The red color filter may be disposed in the first color pixel SPX1, the green color filter may be disposed in the second color pixel SPX2, and the blue color filter may be disposed in the third is color pixel SPX3. The red color filter, the green color filter and the blue color filter may overlap with one another at the boundaries of the color pixels SPX1, SPX2 and SPX3, but the present disclosure is not limited thereto. They may not overlap with one another. FIG. 6 shows a cross-section of the first color pixel SPX1, which may be a red color filter.

An insulating layer 113 may be disposed on the color filter 112. The insulating layer 113 may include an organic insulating material or an inorganic insulating material. According to an exemplary embodiment of the present disclosure, the insulating layer 113 may be an overcoat layer.

A third conductive layer may be disposed on the insulating layer 113. The third conductive layer may include the first sub-pixel electrode 191, the second sub-pixel electrode 192 and the shielding line EFS. Since FIGS. 6 and 7 show the first extended part 191d of the first sub-pixel electrode 191 and the second extended part 192d of the second sub-pixel electrode 192, the first extended part 191d and the second extended part 192d will be described as examples of the first sub-pixel electrode 191 and the second sub-pixel electrode 192, respectively.

The first extended part 191d, the second extended part 192d, and the shielding line EFS may be formed of the third conductive layer. The third conductive layer may be formed of a transparent material that transmits light. The third conductive layer may be formed of indium tin oxide (ITO), indium zinc oxide (IZO), or indium tin zinc oxide (ITZO), for example. It is, however, to be understood that the present disclosure is not limited thereto. The pixel electrode 150 may be formed of any material as long as the material is transparent and conductive.

The first drain electrode DE1 of the first switching element T1 may be electrically connected to the first extended part 191d of the first sub-pixel electrode 191. The insulating layer 113 and the color filter 112 may include a first contact hole CNT1 penetrating therethrough in the thickness direction. The second extended part 192d may be electrically connected to the first drain electrode DE1 of the first switching element T1 through the first contact hole CNT1.

The second drain electrode DE2 of the second switching element T2 may be electrically connected to the second extended part 192d of the second sub-pixel electrode 192. The insulating layer 113 and the color filter 112 may include a second contact hole CNT2 penetrating therethrough in the thickness direction. The second extended part 192d may be electrically connected to the second drain electrode DE2 of the second switching element T2 through the second contact hole CNT2.

The shielding line EFS may be disposed at the same level as the first and second sub-pixel electrodes 191 and 192 and may be disposed on the insulating layer 113. The shielding line EFS may be disposed to overlap with at least a portion of each of the data line DL, the gate line SL, the first switching element T1, and the second switching element T2.

The second substrate SUB2 facing the first substrate SUB1 may include a light-blocking member BM, and a common electrode CE.

The second substrate SUB2 may be a transparent insulating substrate similar to the first substrate SUB1. In addition, the second substrate SUB2 may include a polymer or plastic having high heat resistance. The second substrate SUB2 may have flexibility.

The light-blocking member BM may be disposed on a surface of the second substrate SUB2 facing the first substrate SUB1. The light-blocking member BM may overlap the switching element area TA. The light-blocking member BM may include a light-blocking pigment such as carbon black or an opaque material such as chromium (Cr), and may include a photosensitive organic material. It is, however, to be understood that the present disclosure is not limited thereto. For example, the light-blocking member BM may be disposed in the first substrate SUB1.

The common electrode CE may be disposed on the surface of the light-blocking member BM facing the first substrate SUB1. The common electrode CE may be formed of a transparent conductive material, such as indium tin oxide (ITO), indium zinc oxide (IZO), or indium tin zinc oxide (ITZO). The common electrode CE may be formed over the entire surface of the second substrate SUB2.

The liquid-crystal layer 300 may be disposed between the first substrate SUB1 and the second substrate SUB2. The liquid-crystal layer 300 may include liquid crystals 310 having dielectric anisotropy.

A common voltage is applied to the common electrode CE to form an electric field together with the first sub-pixel electrode 191 and the second sub-pixel electrode 192. In such case, the alignment of the liquid crystals 310 in a liquid-crystal layer 300 is changed according to the magnitude of the electric field, so that the light transmittance can be controlled.

Specifically, when an electric field is formed in the liquid-crystal layer 300 between the first substrate SUB1 and the second substrate SUB2, the liquid crystals 310 rotate in a direction between the first substrate SUB1 and the second substrate SUB2 to thereby adjust phase retardation of the light passing through the liquid-crystal layer 300. The amount of the polarized light (e.g., the light having passed through a lower polarizer) that passes through an upper polarizer (which may be disposed on the exit side and, for example, may be attached to an outer surface of the second substrate) varies depending on a change in the phase retardation by the rotation of the liquid crystals 310. Based on this, it is possible to control the transmittance.

The structure of the second color pixel SPX2 may be the same as that of the first color pixel SPX1. The third color pixel SPX3 is substantially identical to the first color pixel SPX1 except that the voltage-dividing reference line RL is disposed and connected to the first storage line CSTL1 through the third contact hole CNT3, as shown in FIG. 2.

Figure 8:
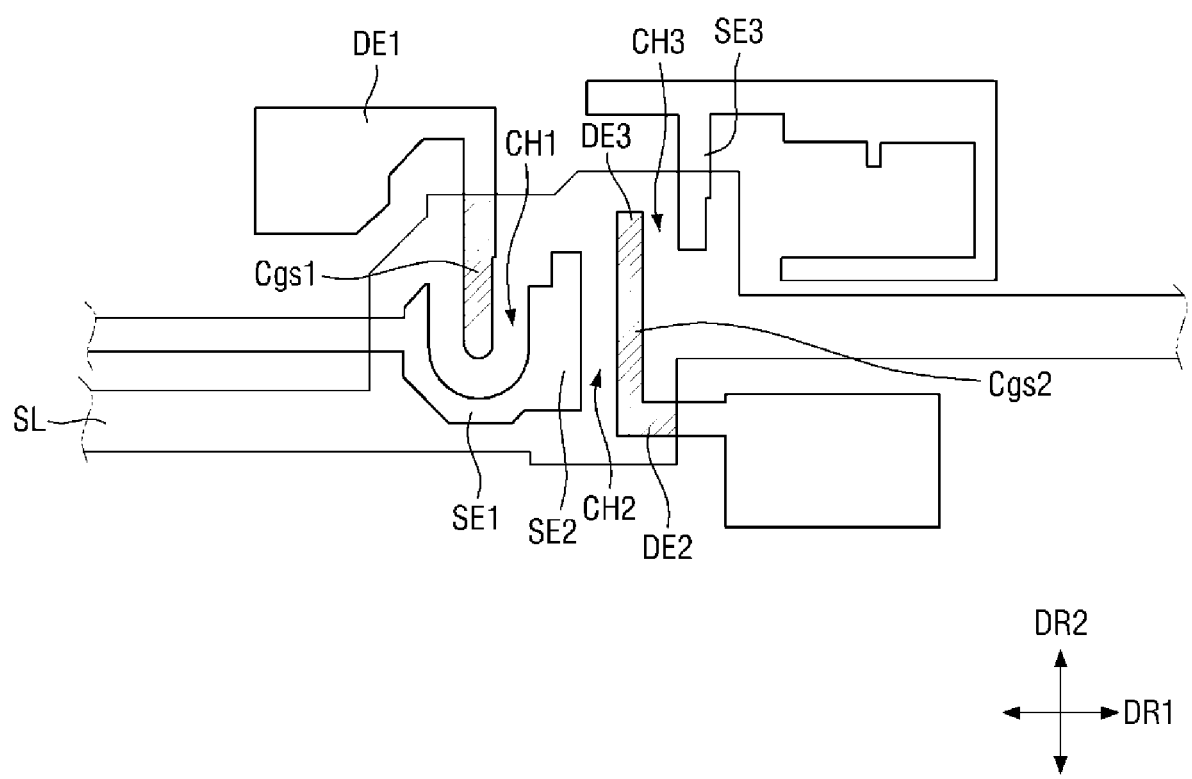
FIGS. 8, 9 and 10 are plan views showing a part of the configuration of a switching element area of a first color pixel according to an embodiment of the inventive concepts.
Figure 9:
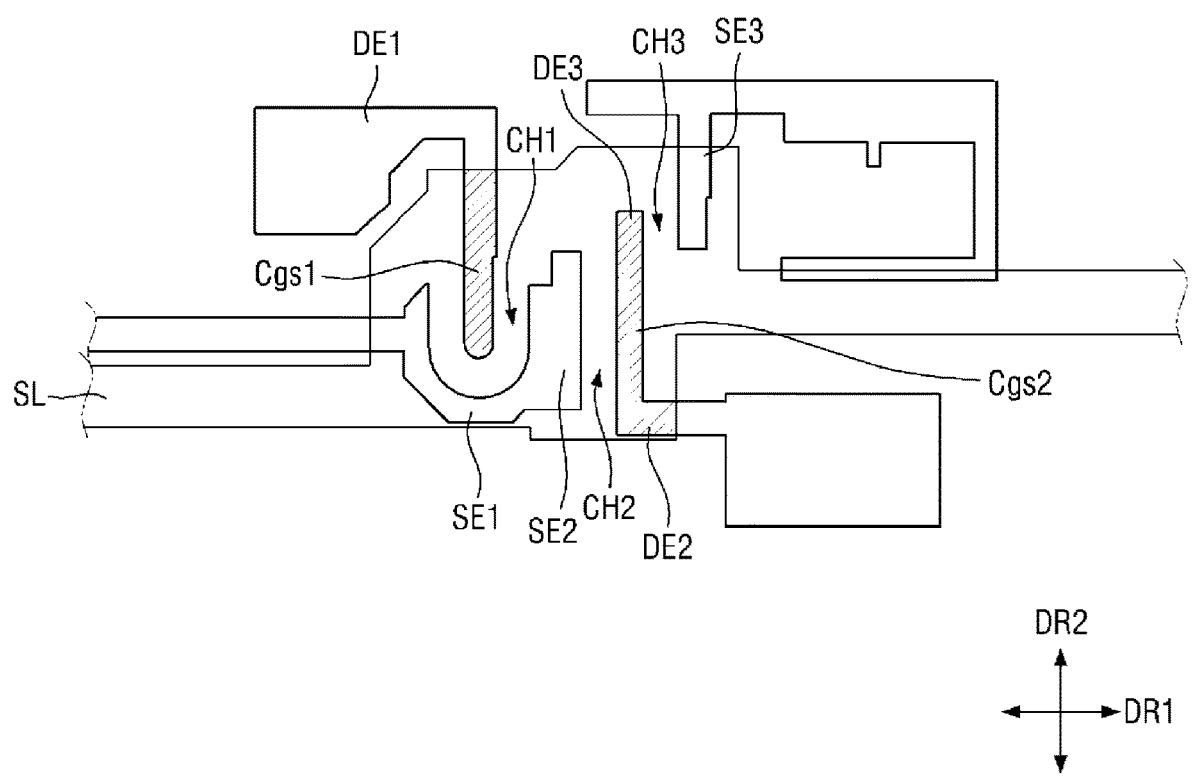
Figure 10:
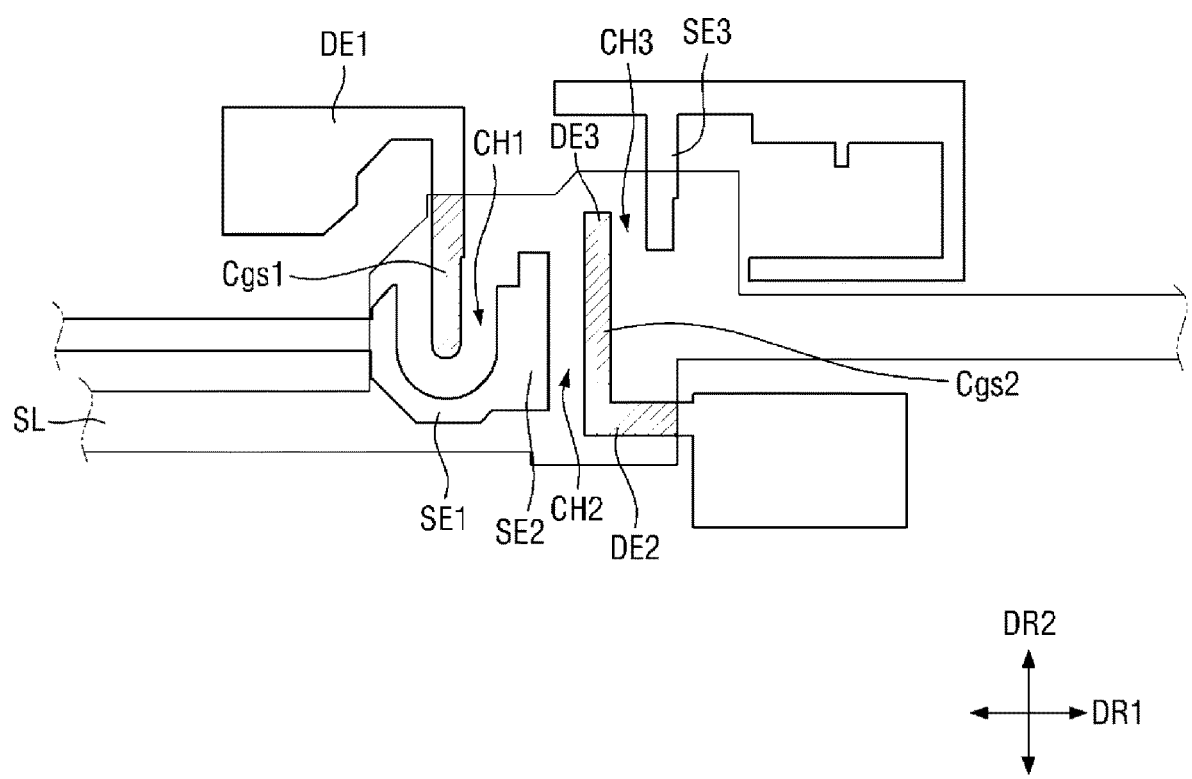
Figure 11:
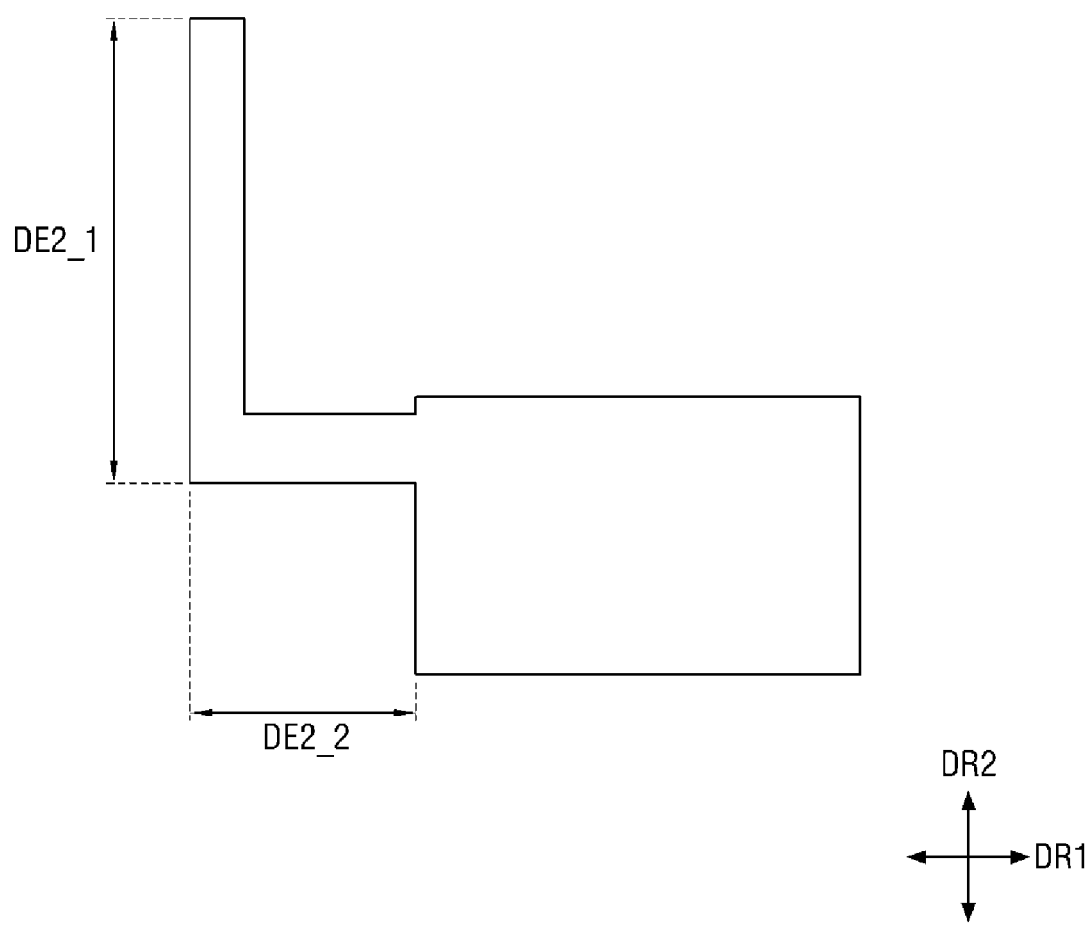
FIG. 11 is a plan view showing a second drain electrode according to an embodiment of the inventive concepts.
Figure 12:
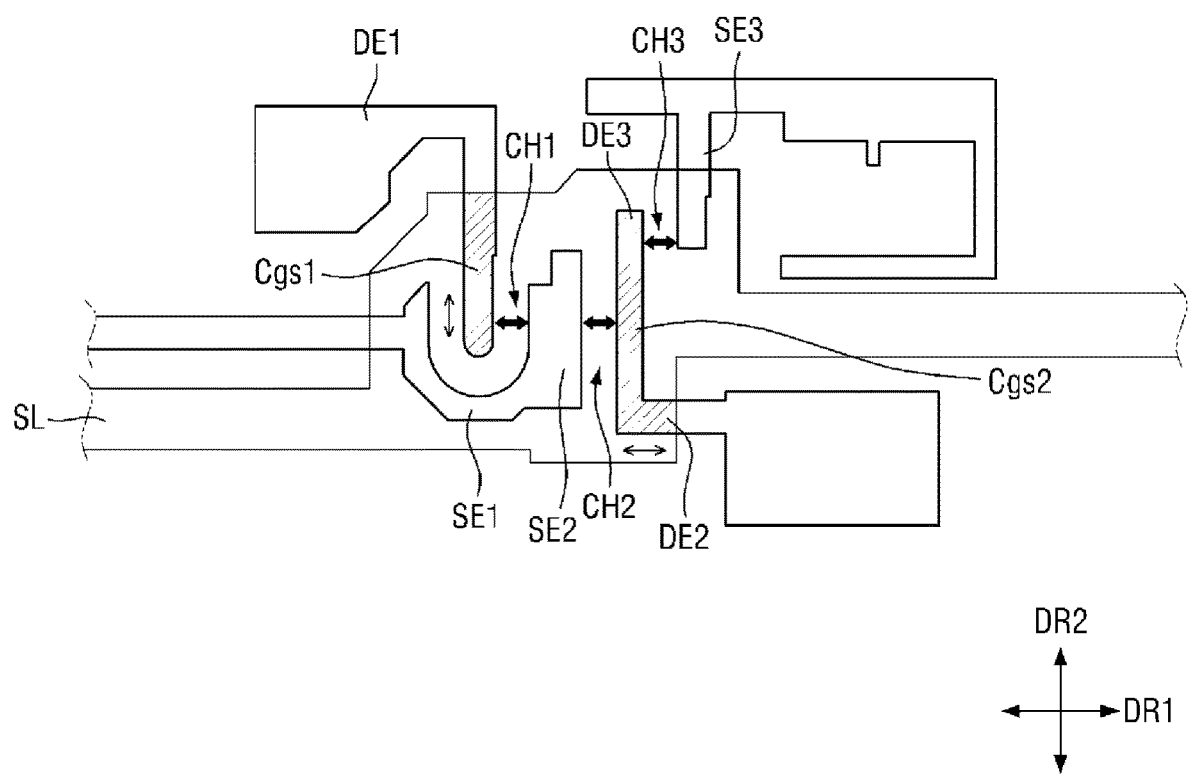
FIG. 12 is a plan view showing a part of the configuration of a switching element area of a first color pixel according to an exemplary embodiment of the inventive concepts.
Figure 13:
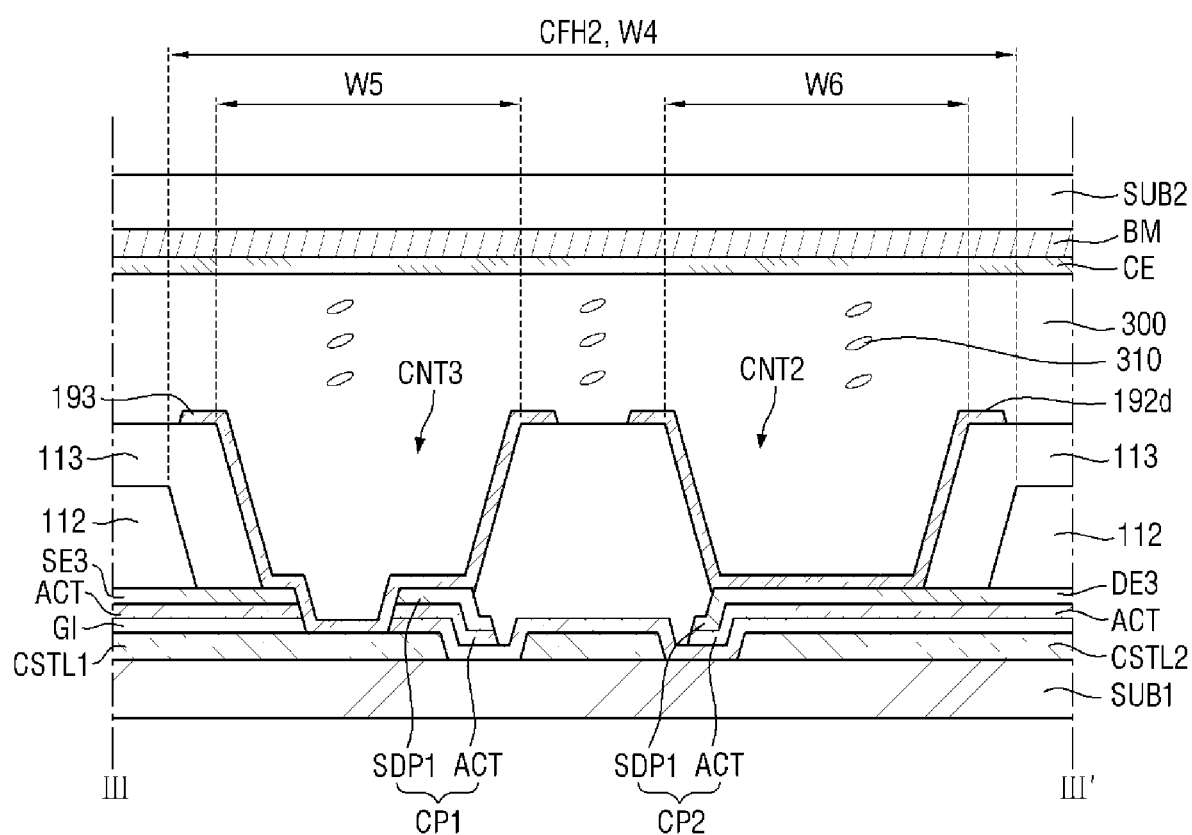
FIG. 13 is a cross-sectional view taken along line III-III' of FIG. 4.

FIGS. 8, 9 and 10 are plan views showing a portion of the configuration of a switching element area of a first color pixel according to an exemplary embodiment of the present disclosure. FIG. 11 is a plan view showing a second drain electrode according to an exemplary embodiment of the present disclosure. FIG. 12 is a plan view showing a portion of the configuration of a switching element area of a first color pixel according to an exemplary embodiment of the present disclosure. FIG. 13 is a cross-sectional view taken along line III-III' of FIG. 4.

In FIG. 8, first to third source electrodes SE1, SE2 and SE3 and first to third drain electrodes DE1, DE2 and DE3 overlapping the gate line SL may be disposed. A first gate-drain capacitor Cgs1 may be formed where the first drain electrode DE1 of the first switching element overlaps the gate line SL, and a second gate-drain capacitor Cgs2 may be formed where the second drain electrode DE2 of the second switching element overlaps the gate line SL.

Each of the first gate-drain capacitor Cgs1 and the second gate-drain capacitor Cgs2 may affect the kickback effect on the data driving signal (data voltage) by the gate driving signal (gate voltage) applied to the gate line SL. The kickback voltage due to the kickback effect may refer to a change in voltage of the data driving signal (data voltage) applied to the first and second sub-pixel electrodes 191 and 192 in a transition direction, which occurs when the gate driving signal (gate voltage) decreases from a high voltage to a lower voltage and the data driving signal is affected by the transition of the gate driving signal (gate voltage).

The kickback voltage of the data driving signal (data voltage) may be calculated by Equation 1 below:

$$Vkb = \frac{Cgs}{(Cst + Clc + Cgs)} \times (Von - Voff), \quad \text{[Equation 1]}$$

where Clc denotes to the liquid-crystal capacitance of the liquid-crystal capacitor formed between the sub-pixel electrodes 191 and 192 and the common electrode CE, Cst denotes the storage capacitance of the storage capacitor formed between the storage lines CSTL1 and CSTL2 and the sub-pixel electrodes 191 and 192, and Cgs denotes the gate-drain capacitance of the gate-drain capacitor formed between the gate electrodes GE1, GE2 and GE3 of the switching element T1, T2 and T3 and the drain electrodes DE1, DE2 and DE3.

According to Equation 1, the kickback voltage may be inversely proportional to the liquid-crystal capacitance of the liquid-crystal capacitor formed between the sub-pixel electrodes 191 and 192 and the common electrode CE, and the storage capacitance of the storage capacitor formed between the storage lines CSTL1 and CSTL2 and the sub-pixel electrodes 191 and 192, and may be proportional to the gate-drain capacitance of the gate-drain capacitor formed between the gate electrodes GE1, GE2 and GE3 of the switching element T1, T2 and T3 and the drain electrodes DE1, DE2 and DE3.

According to an exemplary embodiment of the present disclosure, the first source electrode SE1 overlapping the gate line SL may be formed in a U-shape when viewed from the top, and the first drain electrode DE1 overlapping the gate line SL may be formed in a bar shape when viewed from the top. The first channel region CH1 may be formed where the first drain electrode DE1 and the first source electrode SE1 face each other.

In addition, the second source electrode SE2 overlapping the gate line SL may be formed integrally with the first source electrode SE1, and the second source electrode SE2 may be the first source electrode SE1. The second drain electrode DE2 may be disposed which is spaced apart from the second source electrode SE2 and faces it. A portion of the second drain electrode DE2 facing the second source electrode SE2 may be formed in parallel with the second source electrode SE2. The second channel region CH2 may be formed where the second source electrode SE2 and the second drain electrode DE2 face each other.

A region of the second drain electrode DE2 may overlap the gate line SL, and the region may include a first region extended I the first direction DR1 and a second region extended in the second direction DR2. The first region of the second drain electrode DE2 may be a first horizontal portion DE2_2 extended in the first direction, and the second region of the second drain electrode DE2 may be a first vertical portion DE2_1 extended in the second direction.

The third source electrode SE3 overlapping the gate line SL may be formed in a bar shape when viewed from the top like the first drain electrode DE1 described above. The third drain electrode DE3 may be disposed to face the third source electrode SE3 and a part thereof may be in parallel to the third source electrode SE3. The third drain electrode DE3 may be formed integrally with the second drain electrode DE2, and the third drain electrode DE3 may be the second drain electrode DE2.

As described above, the first gate-drain capacitor Cgs1 may be formed where the first drain electrode DE1 overlaps the gate line SL, and the second gate-drain capacitor Cgs2 may be formed where the second drain electrode DE2 overlaps the gate line SL.

The capacitance of the first gate-drain capacitor Cgs1 may vary depending on the size of the area where the first drain electrode DE1 overlaps the gate line SL. For example, when the area where the first drain electrode DE1 overlaps the gate line SL increases, the capacitance of the first gate-drain capacitor Cgs1 may increase as well. When the area where the first drain electrode DE1 overlaps the gate line SL decreases, the capacitance of the first gate-drain capacitor Cgs1 may decrease as well. The capacitance of the second gate-drain capacitor Cgs2 may vary depending on the area where the second drain electrode DE2 overlaps the gate line SL, similarly to the change in the capacitance of the first gate-drain capacitor Cgs1.

In FIG. 9, the first to third source electrodes SE1, SE2 and SE3 and the first to third drain electrodes DE1, DE2 and DE3 formed of the second conductive layer may be somewhat misaligned toward the lower side of the gate line SL (the lower side of the drawing). When this happens, the area where the first drain electrode DE1 overlaps the gate line SL increases, and accordingly the capacitance of the first gate-drain capacitor Cgs1 may increase as well. Since the area where a portion of the first vertical portion DE2_1 and the first horizontal portion DE2_2 of the second drain electrode DE2 overlaps the gate line SL does not change, the capacitance value of the second gate-drain capacitor Cgs2 may not change.

On the contrary, the first to third source electrodes SE1, SE2 and SE3 and the first to third drain electrodes DE1, DE2 and DE3 formed of the second conductive layer may be somewhat misaligned toward the upper side of the gate line SL (the upper side of the drawing). When this happens, the area where the first drain electrode DE1 overlaps the gate line SL decreases, and accordingly the capacitance of the first gate-drain capacitor Cgs1 may decrease as well. Since the area where a portion of the first vertical portion DE2_1 and the first horizontal portion DE2_2 of the second drain electrode DE2 overlaps the gate line SL does not change, the capacitance value of the second gate-drain capacitor Cgs2 may not change.

In addition, as shown in FIG. 10, the first to third source electrodes SE1, SE2 and SE3 and the first to third drain electrodes DE1, DE2 and DE3 formed of the second conductive layer may be somewhat misaligned toward the right side of the gate line SL (the right side of the drawing). When this happens, the area where the second drain electrode DE2 overlaps the gate line SL decreases, and accordingly the capacitance of the second gate-drain capacitor Cgs2 may decrease as well. While the area where the first vertical portion DE2_1 of the second drain electrode DE2 overlaps the first the gate line SL does not change, the area where the first horizontal portion DE2_2 overlaps the gate line SL may decrease. Since the area where the first drain electrode DE1 overlaps the gate line SL does not change, the capacitance of the first gate-drain capacitor Cgs1 may not change.

On the contrary, the first to third source electrodes SE1, SE2 and SE3 and the first to third drain electrodes DE1, DE2 and DE3 formed of the second conductive layer may be somewhat misaligned toward the left side of the gate line SL (the left side of the drawing). When this happens, the area where the second drain electrode DE2 overlaps the gate line SL increases, and accordingly the capacitance of the second gate-drain capacitor Cgs2 may increase as well. While the area where the first vertical portion DE2_1 of the second drain electrode DE2 overlaps the first the gate line SL does not change, the area where the first horizontal portion DE2_2 overlaps the gate line SL may increase. Since the area where the first drain electrode DE1 overlaps the gate line SL does not change, the capacitance of the first gate-drain capacitor Cgs1 may not change.

As described above, when the capacitance of the gate-drain capacitor increases, the kickback voltage may increase. When the difference between the capacitance of the first gate-drain capacitor Cgs1 and the capacitance of the second gate-drain capacitor Cgs2 increases, the luminance of the first sub-pixel area and the second sub-pixel area may be changed, resulting in mura defects. If the capacitance of the first gate-drain capacitor Cgs1 increases and the capacitance of the second gate-drain capacitor Cgs2 decreases, the difference between the capacitance of the first gate-drain capacitor Cgs1 and the second gate-drain capacitor Cgs2 further increases, resulting in stronger mura defects.

According to an exemplary embodiment of the present disclosure, as shown in FIG. 11, the second drain electrode DE2 may include a first vertical portion DE2_1 extended in the second direction DR2 and a first horizontal portion DE2_2 extended in the first direction DR1 from the end of the first vertical portion DE2_1. The first vertical portion DE2_1 may overlap the gate line SL. A portion of the first horizontal portion DE2_2 may overlap the gate line SL and the other part thereof may not overlap the gate line SL. The first vertical portion DE2_1 may be disposed in parallel with the second source electrode SE2 to face the second source electrode SE2. The first horizontal portion DE2_2 may be extended from one end of the first vertical portion DE2_1, i.e., the end adjacent to the second sub-pixel electrode 192 in the direction away from the data line DL.

In FIG. 12, if the first drain electrode DE1 moves upward or downward (in the second direction DR2), the capacitance of the first gate-drain capacitor Cgs1 may change. If the second drain electrode DE2 moves leftward or rightward (in the first direction DR1), the capacitance of the second gate-drain capacitor Cgs2 may change. According to the exemplary embodiment of the present disclosure, the second drain electrode DE2 includes the first vertical portion DE1-1 and the first horizontal portion DE2_2 overlapping the gate line SL, so that the capacitance of the first gate-drain capacitor Cgs1 and the capacitance of the second gate drain capacitor Cgs2 may change under different conditions (different moving directions of the drain electrodes).

That is to say, only one of the capacitance of the first gate-drain capacitor Cgs1 and the capacitance of the second gate drain capacitor Cgs2 is changed if the source electrodes SE1 and SE2 and the drain electrodes DE1 and DE2 are misaligned with the gate line SL because the capacitance of the first gate-drain capacitor Cgs1 is changed when the drain electrode moves vertically while the capacitance of the second gate drain capacitor Cgs2 is changed when the drain electrode moves horizontally. In this manner, it is possible to prevent a difference between the capacitance of the first gate-drain capacitor Cgs1 and the capacitance of the second gate-drain capacitor Cgs2 from increasing, so that the range that the difference in the kickback voltage between the first sub-pixel area the second sub-pixel area can be reduced. As a result, it is is possible to suppress mura defects.

In addition, as shown in FIG. 12, according to an exemplary embodiment of the present disclosure, the direction of the first channel region CH1 formed between the first source electrode SE1 and the first drain electrode DE1, the direction of the second channel region CH2 formed between the second source electrode SE2 and the second drain electrode DE2, and the direction of the third channel region CH3 formed between the third source electrode SE3 and the third drain electrode DE3 may be all the same.

Specifically, the longitudinal direction of the first channel region CH1 formed between the first source electrode SE1 and the first drain electrode DE1 may be the first direction DR1. The longitudinal direction of the second channel region CH2 formed between the second source electrode SE2 and the second drain electrode DE2 may be the first direction DR1. The longitudinal direction of the third channel region CH3 formed between the third source electrode SE3 and the third drain electrode DE3 may be the first direction DR1. As used herein, the length of the channel region may be the shortest distance between the source electrode and the drain electrode. The length of the first channel region CH1 may be the shortest distance between the first source electrode SE1 and the first drain electrode DE1, the length of the second channel region CH2 may be the shortest distance between the second source electrode SE2 and the second drain electrode DE2, and the length of the third channel region CH3 may be the shortest distance between the third source electrode SE3 and the third drain electrode DE3.

The longitudinal direction of each channel region may be parallel to the first direction DR1, and the width direction thereof may be parallel to the second direction DR2. According to an exemplary embodiment of the present disclosure, the first channel region CH1 may be formed in a U-shape, and thus the channel region have different directions. Although the first channel region CH1 has the U-shape, it can be regarded the first channel region CH1 has the first direction DR1 along the linear portion of the U-shape because the linear portion of the U-shape is larger than the curved portion of the U-shape.

When the first channel region CH1, the second channel region CH2 and the third channel region CH3 have the same direction, it is possible to prevent that the length or width of the channel regions of the switching elements is different from the original design which may occur when the channel regions have different directions. In other words, switching elements having the same channel region direction may be formed as designed, but switching elements having different channel region directions may be formed differently from the design, and thus variations in electrical characteristics, for example, kickback voltage may increase. In contrast, according to the exemplary embodiment of the present disclosure, it is possible to prevent mura defects which may occur if a difference in kickback voltage between switching elements is increased.

Incidentally, referring to FIGS. 4, 5, 6 and 13, the first contact hole CNT1, the second contact hole CNT2 and the third contact hole CNT3 may be disposed such that they overlap via holes of the color filter 112 disposed between the insulating layer 113 and the source electrode SE3.

Specifically, the first drain electrode DE1 of the first switching element T1 may be electrically connected to the first extended part 191d of the first sub-pixel electrode through the first contact hole CNT1. The first contact hole CNT1 may overlap the first via hole CFH1 of the color filter 112 disposed between the first drain electrode DE1 and the first extended part 191d. A first via hole CFH1 may penetrate through the color filter 112 to expose an underlying layer, e.g., the first drain electrode DE1. The first contact hole CNT1 may expose the first drain electrode DE1 through the first via hole CFH1. The first extended part 191d may be electrically connected to the first drain electrode DE1 exposed through the first contact hole CNT1 and the first via hole CFH1.

In addition, the second contact hole CNT2 and the third contact hole CNT3 may overlap the second via hole CFH2. A second via hole CFH2 may penetrate through the color filter 112 to expose underlying layers, e.g., the third source electrode SE3, the gate insulating layer GI and the third drain electrode DE2. The third contact hole CNT3 may penetrate through the gate insulating layer GI disposed between the third source electrode SE3 and the first storage line CSTL1 through the second via hole CFH2, to expose the first storage line CSTL1. The first electrode pattern 193 may be in contact with the third source electrode SE3 and the first storage line CSTL1 exposed through the third contact hole CNT3 and the second via hole CFH2. The second contact hole CNT2 may penetrate through the insulating layer 113 to expose the third drain electrode DE3. The second extended part 192d of the second sub-pixel electrode may be in contact with the third drain electrode DE3 exposed through the second contact hole CNT2 and the second via hole CFH2.

The second contact hole CNT2 and the third contact hole CNT3 may overlap the second via hole CFH2. When viewed from the top, the second contact hole CNT2 and the third contact hole CNT3 may be located in the second via hole CFH2. The width W4 of the second via hole CFH2 in the second direction DR2 may be larger than the width W5 of the third contact hole CNT3 in the second direction DR2 and the width of the second contact hole CNT2 in the second direction DR2. The width W4 of the second via hole CFH2 may be greater than the sum (W5+W6) of the width W5 of the third contact hole CNT3 and the width W6 of the second contact hole CNT2. When the width W4 of the second via hole CFH2 is greater than the sum (W5+W6) of the width W5 of the third contact hole CNT3 and the width W6 of the second contact hole CNT2, the second contact hole CNT2 and the third contact hole CNT3 may be disposed in the single via hole CFH2, thereby preventing the loss of aperture ratio due to the via is holes of the color filter 112.

The second via hole CFH2 may be disposed to overlap the gate line SL. The width W4 of the second via hole CFH2 may cross the gate line SL. In addition, the second contact hole CNT2 and the third contact hole CNT3 may not overlap the gate line SL. That is to say, the second contact hole CNT2 and the third contact hole CNT3 may be spaced apart from the gate line SL.

In addition, according to an exemplary embodiment of the present disclosure, the display device may include a first conductive pattern CP1 and a second conductive pattern CP2 disposed between the gate insulating layer GI and the insulating layer 113.

Specifically, the gate insulating layer GI may be disposed over the first storage line CSTL1, the second storage line CSTL2 and the gate line SL disposed on the first substrate SUB1. The first conductive pattern CP1 and the second conductive pattern CP2 may be disposed on the gate insulating layer GI. The first conductive pattern CP1 may at least partially overlap the first storage line CSTL1 and may not overlap the gate line SL. The second conductive pattern CP2 may at least partially overlap the second storage line CSTL2 and may not overlap the gate line SL.

The first conductive pattern CP1 and the second conductive pattern CP2 may be disposed in the second via hole CFH2. At least a portion of the first conductive pattern CP1 may be exposed through the third contact hole CNT3 and the other part thereof may overlap the insulating layer 113. Therefore, the first conductive pattern CP1 may be in contact with the first electrode pattern 193 disposed on the insulating layer 113 through the third contact hole CNT3. At least a portion of the second conductive pattern CP2 may be exposed through the second contact hole CNT2 and the other part thereof may overlap the insulating layer 113. Therefore, the second conductive pattern CP2 may be in contact with the extended part 192d of the second is sub-pixel electrode 192, i.e., the second electrode pattern disposed on the insulating layer 113 through the second contact hole CNT2.

Each of the first conductive pattern CP1 and the second conductive pattern CP2 may have a structure in which the semiconductor layer ACT and the source pattern SDP1 are stacked. The source pattern SDP1 may be the same pattern as the third source electrode SE3, and may be continuously extended from the third source electrode SE3. Therefore, the source pattern SDP1 may be disposed on the same layer as the third source electrode SE3 and may include the same material.

According to an exemplary embodiment of the present disclosure, the first conductive pattern CP1 and the second conductive pattern CP2 can increase the adhesion with the insulating layer 113. For example, the insulating layer 113 may be formed of an organic material. The color filter 112 may be patterned under the insulating layer 113 to form the second via hole CFH2. If the material for the color filter remains on the gate insulating layer GI at the second via hole CFH2, however, the adhesion between the insulating layer 113 and the gate insulating layer GI is lowered, and thus the insulating layer 113 may be peeled off. In particular, when the gate line SL is disposed in the second via hole CFH2, the material layer for the color filter is thinner where the gate line SL is disposed, while the material layer for the color filter is thicker where the gate line SL is not disposed. During the process of patterning and removing the material layer for the color filter, the thick material layer for the color filter may not be removed completely, and thus the material may remain.

In addition, if the gate insulating layer GI is not properly formed at the edge of the gate line SL, the material for the color filter remains, and thus the insulating layer 113 may be peeled off and the gate line SL may be exposed. The exposed portion of the gate line SL may corrode during the process, and a short-circuit may be created between the gate line SL and the first electrode pattern 193 described above.

According to an exemplary embodiment of the present disclosure, the first conductive pattern CP1 and the second conductive pattern CP2 formed of metal are disposed on the gate insulating layer GI that is adjacent to the gate line SL but does not overlap it. Accordingly, even if the material for the color filter remains, the adhesion between the insulating layer 113 and each of the first conductive pattern CP1 and the second conductive pattern CP2 is excellent, and thus it is possible to prevent the insulating layer 113 from being peeled off. Accordingly, it is possible to prevent the gate line SL from corroding, and accordingly it is possible to prevent a short-circuit between the gate line SL and the first electrode pattern 193.

As described above, the display device according to the exemplary embodiment of the present disclosure can prevent a difference between the capacitance of the first gate-drain capacitor Cgs1 and the capacitance of the second gate-drain capacitor Cgs2 from increasing, so that the range that the difference in the kickback voltage between the first sub-pixel area the second sub-pixel area can be reduced. As a result, it is possible to suppress mura defects. In addition, since the channel regions of the switching elements have the same direction, it is possible to suppress preventing mura defects which may occur when a difference in kickback voltage between the switching elements is increased.

Figure 14:
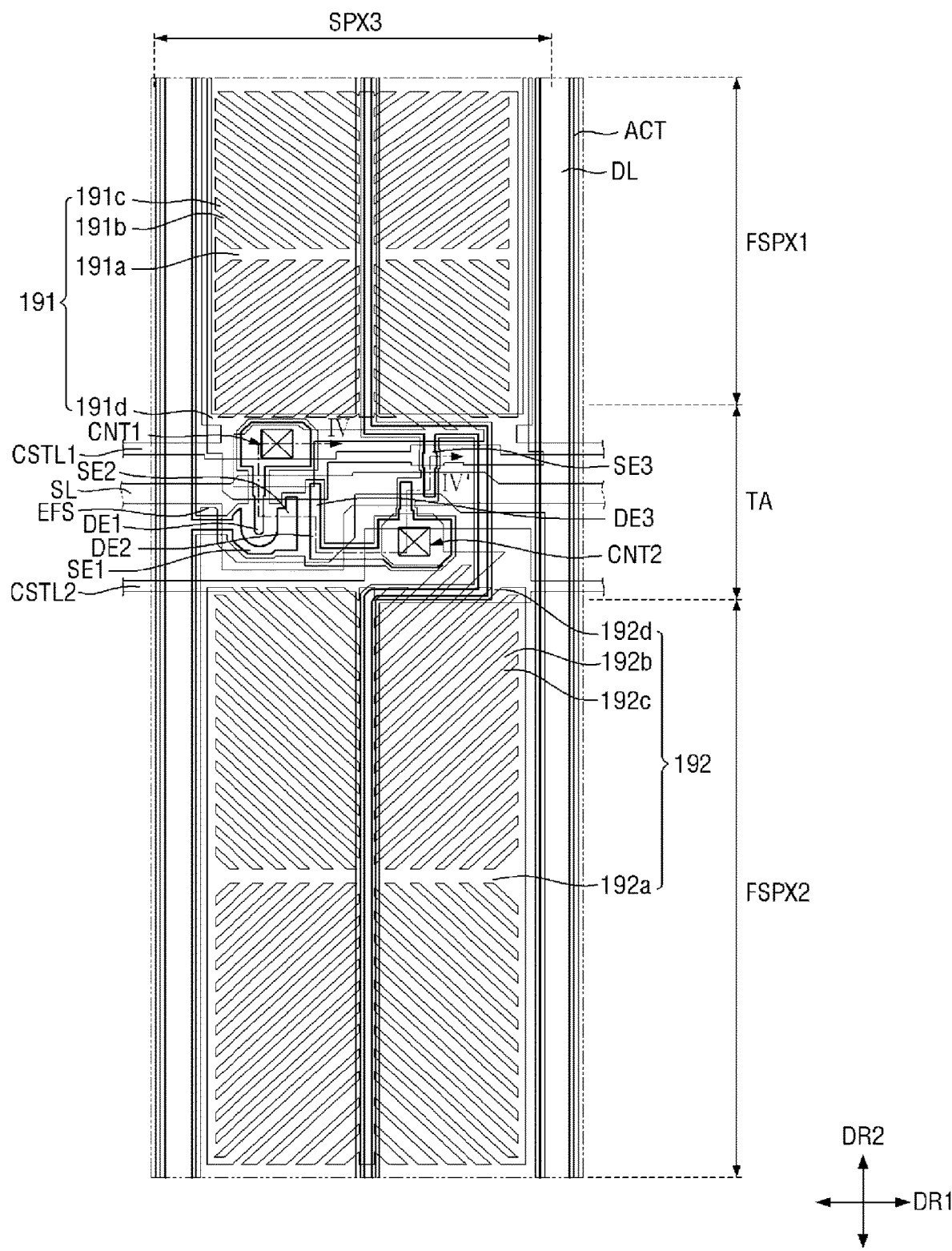
FIG. 14 is a plan view of a display device constructed according to an embodiment of the inventive concepts.
Figure 15:
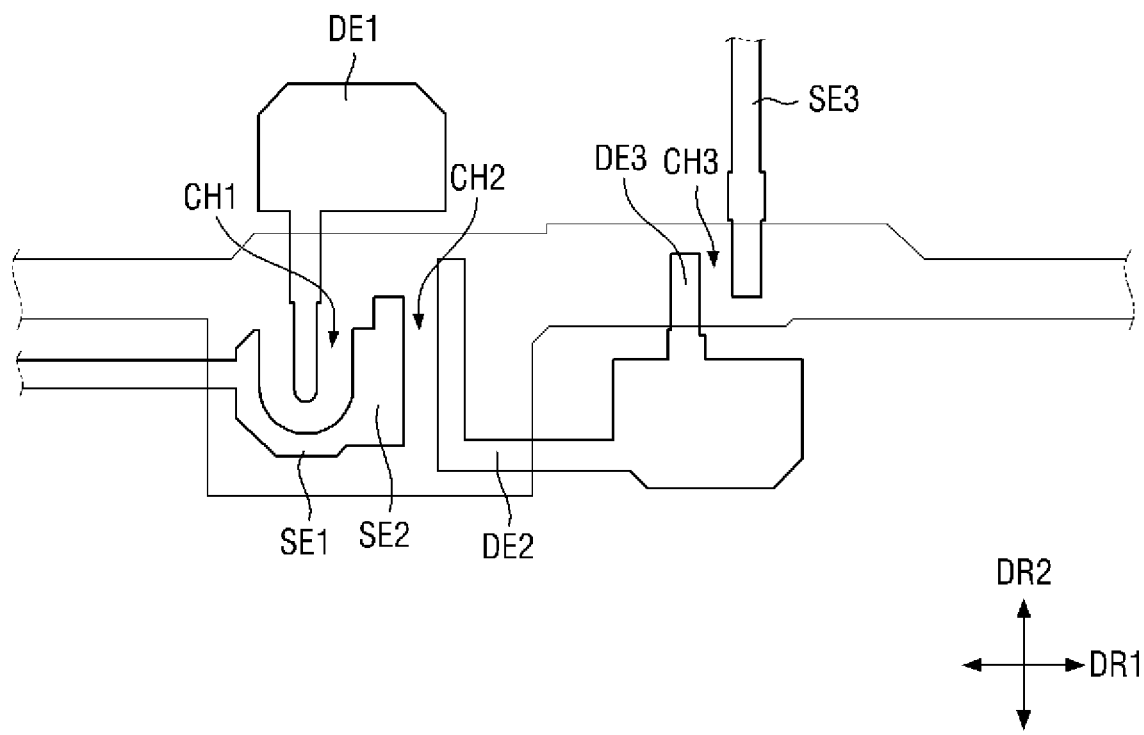
FIG. 15 is a plan view showing a gate line, source electrodes and drain electrodes of one pixel according to an embodiment of the inventive concepts.
Figure 16:
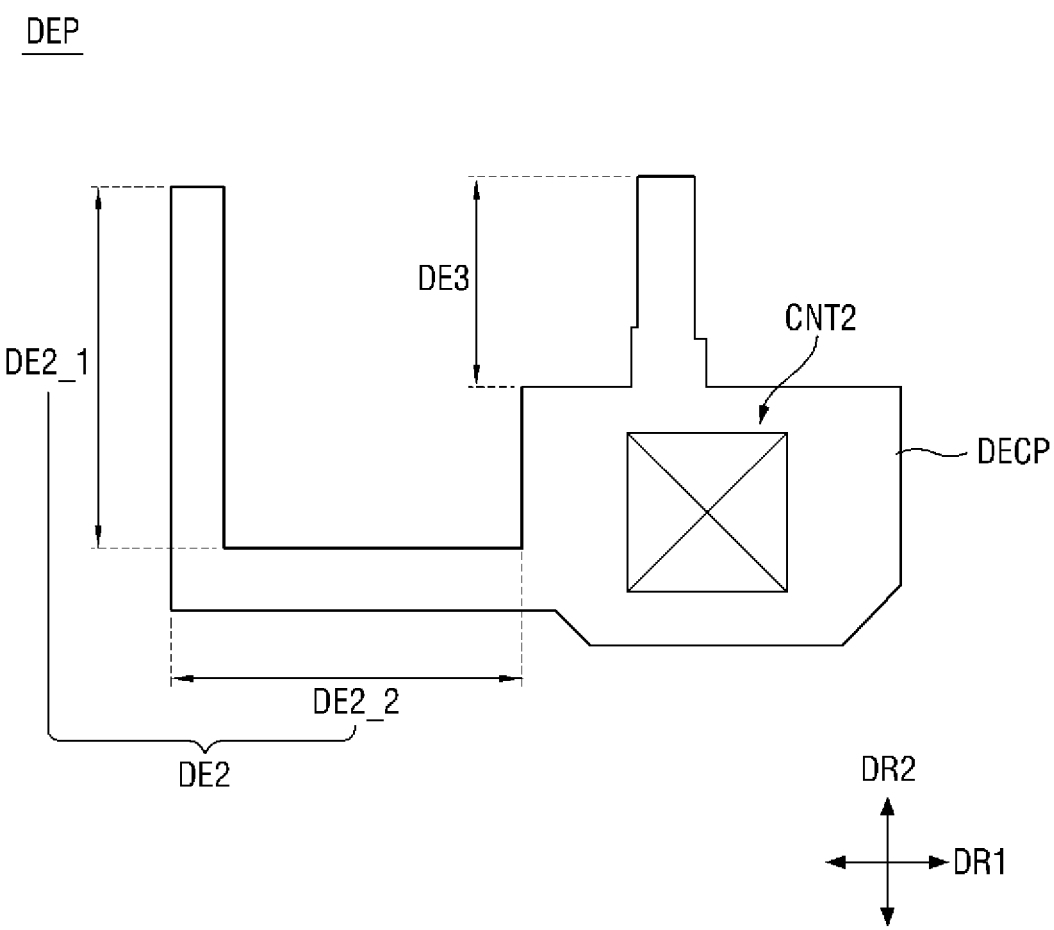
FIG. 16 is a plan view showing a second drain electrode and a third drain is electrode according to an embodiment of the inventive concepts.
Figure 17:
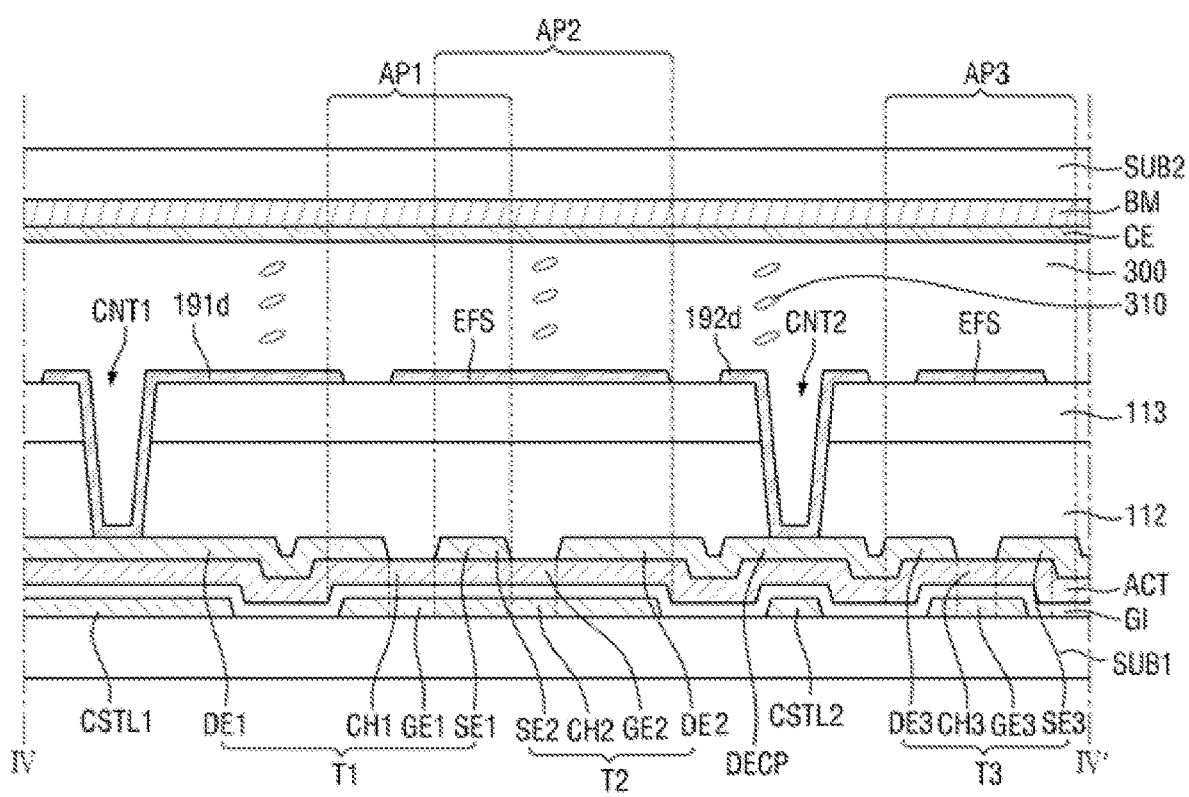
FIG. 17 is a cross-sectional view taken along line IV-IV' of FIG. 14.

FIG. 14 is a plan view showing one pixel according to another exemplary embodiment. FIG. 15 is a plan view showing a gate line, source electrodes and drain electrodes of one pixel according to another exemplary embodiment. FIG. 16 is a plan view showing a second drain electrode and a third drain electrode according to another exemplary embodiment. FIG. 17 is a cross-sectional view taken along line IV-IV' of FIG. 14.

The structure of the pixel according to another exemplary embodiment is substantially identical to that of the pixel according to the above-described exemplary embodiment except that a second switching element is spaced apart from a third switching element. In the following description, the description will focus on the difference, and the same configuration will be briefly described. In the structure of the pixels according to another embodiment, the voltage-dividing reference line is disposed in each of the first to third color pixels, and the structures of the first to third color pixels are similar. In the following description, the description of the first color pixel can be equally applied to the second color pixel and the third color pixel.

In FIG. 14, a first color pixel SPX1 may include a first switching element T1, a second switching element T2, and a third switching element T3.

A first source electrode SE1 of the first switching element T1 may be connected to the data line DL, and a first drain electrode DE1 of the first switching element T1 may be connected to a first sub-pixel electrode 191 through a first contact hole CNT1. The first switching element T1 may include a first gate electrode connected to a gate line SL. According to an exemplary embodiment of the present disclosure, the first gate electrode may be a gate line SL.

The second source electrode SE2 of the second switching element T2 may be connected to the data line DL. The second source electrode SE2 may be formed integrally with the first source electrode SE1. The second drain electrode DE2 of the second switching element T1 may be connected to the second sub-pixel electrode 192 through the second contact hole CNT2. The second switching element T2 may include a second gate electrode connected to the gate line SL. According to an exemplary embodiment of the present disclosure, the second gate electrode may be the gate line SL.

The third source electrode SE3 of the third switching element T3 may be connected to the voltage-dividing reference line RL and may be formed integrally with it. The third drain electrode DE3 of the third switching element T3 may be extended in one direction and may be connected to the second sub-pixel electrode 192 through the above-described second contact hole CNT2. The third switching element T3 may include a third gate electrode connected to the gate line SL. According to an exemplary embodiment of the present disclosure, the third gate electrode may be the gate line SL.

The first color pixel SPX1 may include the first sub-pixel electrode 191 and the second sub-pixel electrode 192.

Most of the first sub-pixel electrode 191 may be disposed in the first sub-pixel area FSPX1, and most of the second sub-pixel electrode 192 may be disposed in the second sub-pixel area FSPX2. The first sub-pixel electrode 191 may include a first stem 191a disposed in the first sub-pixel area FSPX1, first branches 191b disposed in the first sub-pixel area PA1, extended outward from the first stem 191a and spaced apart from one another with a slit 191c therebetween, and a first extended part 191d extended from the first sub-pixel area FSPX1 to the switching element area TA. The second sub-pixel electrode 192 may include a second stem 192a disposed in the second sub-pixel area FSPX1, second branches 192b disposed in the second sub-pixel area FSPX2, extended outward from the second stem 192a and spaced apart from one another with a slit 192c therebetween, and a second extended part 192d extended from the second sub-pixel area FSPX2 to the switching element area TA.

The first color pixel SPX1 may further include a shielding line EFS. The shielding line EFS may be disposed directly on the same layer and may include the same material as the first and second sub-pixel electrodes 191 and 192 described above. The shielding line EFS may be disposed to overlap with at least a portion of each of the data line DL, the gate line SL, and the first to third switching elements T1, T2 and T3, and may form a parasitic capacitor with a common electrode CE. By doing so, it is possible to prevent the liquid crystals from failing.

It is to be noted that the second switching element T2 and the third switching element T3 are spaced apart from each other according to the exemplary embodiment of the present disclosure.

Referring to FIGS. 14 and 15, since the first source electrode SE1 of the first switching element T1 and the second source electrode SE2 of the second switching element T2 share one source pattern, the first switching element T1 and the second switching element T2 may be disposed adjacent to each other. The first channel region CH1 of the first switching element T1 may be disposed adjacent to the second channel region CH2 of the second switching element T2, with the first and second source electrodes SE1 and SE2 interposed therebetween.

The third switching element T3 may be spaced apart from the first switching element T1 and the second switching element T2. In the above-described exemplary embodiment, the first switching element T1 and the second switching element T2 may share the source electrode, and the second switching element T2 and the third switching element T3 may share the drain electrode. In contrast, according to this exemplary embodiment, the first switching element T1 and the second switching element T2 may share the source electrode, and the second switching element T2 and the third switching element T3 may not share the drain electrode. That is to say, each of the second switching element T2 and the third switching element T3 may have its own drain electrode separately.

Specifically, referring to FIG. 16, the second drain electrode DE2 and the third drain electrode DE3 may be formed of the single drain pattern DEP. The drain pattern DEP may include a second drain electrode DE2, a third drain electrode DE3, and a drain contact DECP disposed between the second drain electrode DE2 and the third drain electrode DE3.

The drain contact DECP may be a portion of the drain pattern DEP which overlaps the second extended part 192d of the second sub-pixel electrode. The drain contact DECP may have a generally quadrangular shape when viewed from the top, and a second contact hole CNT2 may be formed substantially at the center which may be in contact with the second extended part 192d.

The second drain electrode DE2 may be extended from the drain contact DECP. The second drain electrode DE2 may be extended from one side of the drain contact DECP toward the second source electrode SE2 adjacent thereto in the first direction DR1. The second drain electrode DE2 may include a first horizontal portion DE2_2 extended from one side of the drain contact DECP toward the second source electrode SE2 adjacent thereto in the first direction DR1, and a first vertical portion DE2_1 extended from one end of the first horizontal portion DE2_2 toward the first storage line CSTL1 adjacent thereto in the second direction DR2. The second drain electrode DE2 may be extended from another side of the drain contact DECP toward the first storage line CSTL1 adjacent thereto in the second direction DR2. For example, the second drain electrode DE2 may be extended toward the 9 o'clock position from the drain contact DECP when viewed from the top, and the third drain electrode DE3 may be extended toward 12 o'clock position from the drain contact DECP when viewed from the top.

As described above, according to the exemplary embodiment of the present disclosure, the second drain electrode DE2 and the third drain electrode DE3 are spaced apart from each other with the drain contact DECP therebetween, and accordingly the second switching element T2 and the third switching element T3 are spaced apart from each other. As the second switching element T2 and the third switching element T3 are spaced apart from each other, there is an advantage that pixels can be designed more freely.

In the cross-sectional structure of one pixel shown in FIGS. 14 and 17, the display device according to another exemplary embodiment may include a first substrate SUB1 and a second substrate SUB2 facing the first substrate SUB1. A plurality of pixels PX described above may be disposed on the first substrate SUB1, and a common electrode CE may be disposed on the second substrate SUB2. A liquid-crystal layer 300 including the liquid crystals 310 may be disposed between the pixels PX of the first substrate SUB1 and the common electrode CE of the second substrate SUB2.

A first gate electrode GE1, a second gate electrode GE2, a third gate electrode GE3, a first storage line CSTL1 and a second storage line CSTL2 may be disposed on the first substrate SUB1. The first gate electrode GE1 may be the gate electrode of the first switching element T1, the second gate electrode GE2 may be the gate electrode of the second switching element T2, and the third gate electrode GE3 may be the gate electrode of the third switching element T3. According to an exemplary embodiment of the present disclosure, the first gate electrode GE1, the second gate electrode GE2, and the third gate electrode GE3 may be the gate line SL.

A gate insulating layer GI may be disposed over the first gate electrode GE1, the second gate electrode GE2, the third gate electrode GE3, the first storage line CSTL1 and the second storage line CSTL2 to insulate them from one another. A semiconductor layer ACT is disposed on the gate insulating layer GI. The semiconductor layer may include a first semiconductor region AP1, a second semiconductor region AP2, and a third semiconductor region AP3. The first semiconductor region AP1 to the third semiconductor region AP3 include channel regions CH1, CH2 and CH3, respectively.

The first to third source electrodes SE1, SE2 and SE3 and the first to third drain electrodes DE1, DE2 and DE3 may be disposed on the semiconductor layer ACT, and the color filter 112 may be disposed thereon. An insulating layer 113 may be disposed on the color filter 112. The first extended part 191d of the first sub-pixel electrode, the second extended part 192d of the second sub-pixel electrode, and the shielding line EFS may be disposed on the insulating layer 113. The first drain electrode DE1 of the first switching element T1 may be electrically connected to the first extended part 191d of the first sub-pixel electrode through the first contact hole CNT1, and the second drain electrode DE2 of the second switching element T2 may be electrically connected to the second extended part 192d of the second sub-pixel electrode through the second contact hole CNT2.

The second substrate SUB2 facing the first substrate SUB1 may include a light-blocking member BM, and a common electrode CE. A light-blocking member BM may be disposed on one surface of the second substrate SUB2 facing the first substrate SUB1, and the common electrode CE may be disposed on one surface of the light-blocking member BM. The liquid-crystal layer 300 including the liquid crystals 310 may be disposed between the first substrate SUB1 and the second substrate SUB2.

As described above, the second drain electrode DE2 and the third drain electrode DE3 are spaced apart from each other another with the drain contact DECP therebetween, and accordingly the second switching element T2 and the third switching element T3 may be spaced apart from each other. As the second switching element T2 and the third switching element T3 are spaced apart from each other, there is an advantage that pixels can be designed more freely.

When a black image is represented by the pixels of the display device according to the exemplary embodiment of FIG. 14, the kickback voltage of each of the first sub-pixel area and the second sub-pixel area, the difference in kickback voltage between the first sub-pixel area and the second sub-pixel area, and the range of the difference in kickback voltage between the first sub-pixel area and the second sub-pixel area were measured. In doing so, the range of the difference in kickback voltage between the first sub-pixel area and the second sub-pixel area was measured from a number of display devices including pixels having the same structure.

According to the example, the kickback voltage of the first sub-pixel area was 3.32 V, and the kickback voltage of the second sub-pixel area was 2.99 V. The difference in kickback voltage between the first sub-pixel area and the second sub-pixel area was 0.33 V, and the range of the difference in kickback voltage between the first sub-pixel area and the second sub-pixel area was 0 to 0.7 V.

It can be seen from the above results that the range of the difference in kickback voltage between the first sub-pixel area and the second sub-pixel area of the display device according to the exemplary embodiment of the present disclosure has been improved to approximately 0.7 V or less.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a gate line extended in a first direction and a data line extended in a second direction crossing the first direction on a substrate;
a first switching element comprising a first source electrode connected from the data line, a first drain electrode spaced apart from the first source electrode, and a first gate electrode connected to the gate line; and
a second switching element comprising a second source electrode connected to the data line, a second drain electrode spaced apart from the second source electrode, and a second gate electrode connected to the gate line
a storage line disposed in parallel with the gate line;
a third switching element comprising a third source electrode connected from the storage line;
a third drain electrode spaced apart from the third source electrode; and
a third gate electrode connected to the gate line,
wherein a region of the first drain electrode overlapping the first gate electrode is extended in the second direction,
wherein the second source electrode is extended in the second direction, and is disposed in parallel with the first drain electrode and the second drain electrode,
wherein a region of the second drain electrode overlapping the second gate electrode includes a first region extended in the first direction and a second region extended in the second direction, and
wherein the third drain electrode is directly connected to the second drain electrode, and wherein the third source electrode and the second region of the second drain electrode face each other and arranged in parallel.

2. The display device of claim 1, wherein the second region of the second drain electrode and the second source electrode face each other and arranged in parallel, and wherein the first region of the second drain electrode forms a substantially linear-shaped region that is perpendicular to the second region of the second drain electrode that also forms a substantially linear-shaped region.

3. The display device of claim 2, wherein the second region of the second drain electrode entirely overlaps the gate line, and a portion of the first region of the second drain electrode does not overlap the gate line.

4. The display device of claim 3, wherein the first switching element comprises a first semiconductor region in which a first channel region is formed between the first source electrode and the first drain electrode, and the second switching element comprises a second semiconductor region in which a second channel region is formed between the second source electrode and the second region of the second drain electrode.

5. The display device of claim 4, wherein a longitudinal direction of each of the first channel region and the second channel region is parallel to the first direction.

6. The display device of claim 5, wherein a length of the first channel region is a shortest distance between the first source electrode and the first drain electrode, and wherein a length of the second channel region is a shortest distance between the second source electrode and the second drain electrode.

7. The display device of claim 6, wherein the first source electrode and the second source electrode are disposed directly on a same layer and formed of a same material.

8. A display device comprising:
a gate line extended in a first direction and a data line extended in a second direction crossing the first direction on a substrate;
a first switching element comprising a first source electrode connected from the data line, a first drain electrode spaced apart from the first source electrode, and a first gate electrode connected to the gate line; and
a second switching element comprising a second source electrode connected to the data line, a second drain electrode spaced apart from the second source electrode, and a second gate electrode connected to the gate line,
wherein a region of the first drain electrode overlapping the first gate electrode is extended in the second direction,
wherein the second source electrode is extended in the second direction, and is disposed in parallel with the first drain electrode and the second drain electrode,
wherein a region of the second drain electrode overlapping the second gate electrode includes a first region extended in the first direction and a second region extended in the second direction,
wherein the first switching element comprises a first semiconductor region in which a first channel region is formed between the first source electrode and the first drain electrode, and the second switching element comprises a second semiconductor region in which a second channel region is formed between the second source electrode and the second region of the second drain electrode, and
wherein the third switching element comprises a third semiconductor region in which a third channel region is formed between the third source electrode and the second region of the second drain electrode.

9. The display device of claim 8, wherein a longitudinal direction of each of the first channel region, the second channel region and the third channel region is parallel to the first direction.

10. The display device of claim 1, further comprising:
the storage line disposed in parallel with the gate line;
a color filter disposed on the first to third source electrodes and the first to third drain electrodes; and
an insulating layer disposed on the color filter,
wherein the color filter includes a first via hole exposing the first drain electrode and a second via hole exposing the third source electrode and the second drain electrode, and
wherein the insulating layer includes a first contact hole exposing the first drain electrode, a second contact hole exposing the third source electrode, and a third contact hole exposing the second drain electrode.

11. The display device of claim 10, wherein the first contact hole overlaps the first via hole, and the second contact hole and the third contact hole overlap the second via hole.

12. The display device of claim 11, wherein the first drain electrode is connected to an adjacent first sub-pixel electrode through the first contact hole, the third source electrode is connected to the storage line through the second contact hole, and the second drain electrode is connected to an adjacent second sub-pixel electrode through the third contact hole.

13. The display device of claim 11, further comprising:
a first conductive pattern extended from the third source electrode and overlapping the second contact hole and the second via hole; and
a second conductive pattern extended from the second drain electrode and overlapping the third contact hole and the second via hole,
a first conductive pattern extended from the third source electrode and overlapping the second contact hole and the second via hole; and
a second conductive pattern extended from the second drain electrode and overlapping the third contact hole and the second via hole,
wherein the first conductive pattern and the second conductive pattern are spaced apart from each other, with the gate line and an insulating layer disposed therebetween, with respect to a cross-sectional view of the substrate, and do not overlap the gate line.

* * * * *